United States Patent
Kametani

(10) Patent No.: US 12,401,378 B2
(45) Date of Patent: Aug. 26, 2025

(54) OPTICAL COMMUNICATION SYSTEM

(71) Applicant: Mitsubishi Electric Corporation, Tokyo (JP)

(72) Inventor: Soichiro Kametani, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 2 days.

(21) Appl. No.: 18/616,630

(22) Filed: Mar. 26, 2024

(65) Prior Publication Data

US 2024/0267657 A1    Aug. 8, 2024

Related U.S. Application Data

(63) Continuation of application No. PCT/JP2021/042406, filed on Nov. 18, 2021.

(51) Int. Cl.
*H03M 13/11* (2006.01)
*H04Q 11/00* (2006.01)

(52) U.S. Cl.
CPC .... *H03M 13/1128* (2013.01); *H04Q 11/0062* (2013.01); *H04Q 2011/0083* (2013.01);
(Continued)

(58) Field of Classification Search
CPC ..... H04L 1/22; H04L 1/41; H04L 1/45; H04L 1/57; H03M 13/1128; H03M 13/1105; H03M 13/3707; H03M 13/3753
See application file for complete search history.

(56) References Cited

U.S. PATENT DOCUMENTS

2003/0156840 A1    8/2003    Uchikata
2009/0238574 A1    9/2009    Sone
(Continued)

FOREIGN PATENT DOCUMENTS

JP    2003-218792 A    7/2003
JP    2009-38707 A     2/2009
(Continued)

OTHER PUBLICATIONS

German Office Action for German Application No. 11 2021 008 218.3, dated Mar. 7, 2025, with English translation.
(Continued)

*Primary Examiner* — Shelly A Chase
(74) *Attorney, Agent, or Firm* — Birch, Stewart, Kolasch & Birch, LLP

(57) ABSTRACT

An optical communication system includes a transmission unit that performs error correction encoding on information to be transmitted, and outputs a result of the error correction encoding as an optical signal, an optical coupler that branches the optical signal, and outputs first and second optical signals, first and second error correction decoding units that each perform error correction decoding on an optical signal, and a communication disconnection detection unit that, upon detection of a disconnection of communication of the first optical signal, notifies, of the disconnection, the second error correction decoding unit. The second error correction decoding unit performs error correction decoding on the second optical signal when a notification of the disconnection has been received. The first error correction decoding unit performs the error correction decoding with a smaller number of iterations than the number of iterations used by the second error correction decoding unit.

6 Claims, 11 Drawing Sheets

(52) U.S. Cl.
CPC ........... *H04Q 2011/0092* (2013.01); *H04Q 2213/13168* (2013.01)

(56) References Cited

U.S. PATENT DOCUMENTS

| | | | | |
|---|---|---|---|---|
| 2011/0231729 | A1* | 9/2011 | Paranjape | H03M 13/3753 714/752 |
| 2017/0149456 | A1* | 5/2017 | Jeon | H04L 1/0041 |
| 2020/0382134 | A1* | 12/2020 | Ishii | H03M 13/3707 |
| 2022/0173815 | A1 | 6/2022 | Wakabayashi et al. | |

FOREIGN PATENT DOCUMENTS

| | | |
|---|---|---|
| JP | 2009-225243 A | 10/2009 |
| JP | 2015-115657 A | 6/2015 |
| JP | 2016-82345 A | 5/2016 |
| WO | WO 2021/100083 A1 | 5/2021 |

OTHER PUBLICATIONS

International Search Report (PCT/ISA/210) issued in PCT/JP2021/042406, dated Jan. 25, 2022.

Kubo et al., "A Study on Power-scaling of Triple-concatenated FEC for Optical Transport Network", The Insitute of Electronics, Infromation and Communication Engineers, IEICE Technical Report, 2016, vol. 116, No. 112, pp. 37-42.

* cited by examiner

|  | THE NUMBER OF FIRST SYSTEMS (TWO TRANSMISSION SIGNALS) | THE NUMBER OF SECOND SYSTEMS (THREE TRANSMISSION SIGNALS) |
|---|---|---|
| N IS EVEN NUMBER | N/2 | 0 |
| N IS ODD NUMBER | (N-3)/2 | 1 |

FIG.10

|  | THE NUMBER OF FIRST SYSTEMS (TWO TRANSMISSION SIGNALS) | THE NUMBER OF SECOND SYSTEMS (THREE TRANSMISSION SIGNALS) |
|---|---|---|
| N IS MULTIPLE OF 3 | 0 | N/3 |
| N IS MULTIPLE OF 3 + 1 | 2 | (N-4)/3 |
| N IS MULTIPLE OF 3 + 2 | 1 | (N-2)/3 |

FIG. 14

| RESULT OF DETERMINATION OF SIGNAL FROM TRANSMISSION UNIT 10-1 MADE BY COMMUNICATION DISCONNECTION DETECTION UNIT 51-1 | RESULT OF DETERMINATION OF SIGNAL FROM TRANSMISSION UNIT 10-1 MADE BY COMMUNICATION DISCONNECTION DETECTION UNIT 51-2 | RESULT OF DETERMINATION OF SIGNAL FROM TRANSMISSION UNIT 10-1 MADE BY COMMUNICATION DISCONNECTION DETECTION UNIT 51-6 | RESULT OF DETERMINATION OF SIGNAL FROM TRANSMISSION UNIT 10-1 MADE BY COMMUNICATION DISCONNECTION DETECTION UNIT 51-7 | PROCESSING ON SIGNAL FROM TRANSMISSION UNIT 10-1 PERFORMED BY ERROR CORRECTION DECODING UNIT 42-1 | PROCESSING ON SIGNAL FROM TRANSMISSION UNIT 10-1 PERFORMED BY ERROR CORRECTION DECODING UNIT 42-2 | PROCESSING ON SIGNAL FROM TRANSMISSION UNIT 10-1 PERFORMED BY ERROR CORRECTION DECODING UNIT 42-6 | PROCESSING ON SIGNAL FROM TRANSMISSION UNIT 10-1 PERFORMED BY ERROR CORRECTION DECODING UNIT 42-7 |
|---|---|---|---|---|---|---|---|
| RECEPTION SUCCESSFUL | STATE DOES NOT MATTER | STATE DOES NOT MATTER | STATE DOES NOT MATTER | PERFORM DECODING | DISCARD | DISCARD | DISCARD |
| DISCONNECTION OF COMMUNICATION | RECEPTION SUCCESSFUL | STATE DOES NOT MATTER | STATE DOES NOT MATTER | DISCARD | PERFORM DECODING | DISCARD | DISCARD |
| DISCONNECTION OF COMMUNICATION | DISCONNECTION OF COMMUNICATION | RECEPTION SUCCESSFUL | STATE DOES NOT MATTER | DISCARD | DISCARD | PERFORM DECODING | DISCARD |
| DISCONNECTION OF COMMUNICATION | DISCONNECTION OF COMMUNICATION | DISCONNECTION OF COMMUNICATION | STATE DOES NOT MATTER | DISCARD | DISCARD | DISCARD | PERFORM DECODING |

OPTICAL COMMUNICATION SYSTEM

CROSS-REFERENCE TO RELATED APPLICATION

This application is a continuation application of International Application PCT/JP2021/042406, filed on Nov. 18, 2021, and designating the U.S., the entire contents of which are incorporated herein by reference.

BACKGROUND OF THE INVENTION

1. Field of the Invention

The present disclosure relates to an optical communication system.

2. Description of the Related Art

A technology for use in an optical communication system is known in which an optical signal is branched using an optical coupler to make the system redundant. For example, Japanese Patent Application Laid-open No. 2003-218792 discloses that a system is made redundant using an optical coupler having an asymmetric branching ratio. Branching an optical signal using an optical coupler enables a system to be made redundant without using an optical switch, thereby enabling reduction in risk of fault occurrence. In addition, use of an optical coupler having an asymmetric branching ratio can increase the branching ratio of an optical signal directed to the active system.

However, the foregoing conventional technology provides a low branching ratio for an optical signal directed to the standby system, thereby resulting in a low received power in a reception device, and hence in an increase in the error rate. The error rate can be reduced by increasing the number of iterations in error correction decoding to be performed on a signal received, which in turn presents a problem in an increase in power consumption.

SUMMARY OF THE INVENTION

In order to solve the above-described problems and achieve the object, an optical communication system according to the present disclosure includes: a transmission unit to perform error correction encoding on information to be transmitted, and to output a result of the error correction encoding in a form of an optical signal, the error correction encoding enabling correction performance to be provided that is dependent on a number of iterations of decoding; an optical branching unit to branch, at an asymmetric branching ratio, the optical signal output by the transmission unit, and to output a first optical signal corresponding to a highest branching ratio and a second optical signal corresponding to a non-highest branching ratio; a plurality of reception units each to receive at least one optical signal of the first optical signal or the second optical signal; an error correction decoding unit provided correspondingly to each of the plurality of reception units to perform error correction decoding on the at least one optical signal received by a corresponding one of the reception units as many times as a number of iterations that has been set; and a communication disconnection detection unit to, upon detection of a disconnection of communication of the first optical signal, notify, of the disconnection of communication, the error correction decoding unit that is to process the second optical signal branched from an optical signal common to the first optical signal. A plurality of optical signals obtained by branching from a common optical signal are received by different ones of the reception units, the error correction decoding unit that is to process the second optical signal does not perform error correction decoding on the second optical signal during normal operation in which no notification has been received of the disconnection of communication, but performs error correction decoding on the second optical signal when a notification of the disconnection of communication has been received, and the error correction decoding unit that processes the first optical signal performs the error correction decoding with a smaller number of iterations than a number of iterations used by the error correction decoding unit that processes the second optical signal.

BRIEF DESCRIPTION OF THE DRAWINGS

FIG. 10 is a diagram illustrating a second example of combination of the number of first systems and the number of second systems included in the optical communication system according to the third variation of the second embodiment;

FIG. 14 is a diagram illustrating operations of part of the optical communication system illustrated in FIG. 13;

DETAILED DESCRIPTION OF THE PREFERRED EMBODIMENTS

An optical communication system according to embodiments of the present disclosure will be described in detail below with reference to the drawings. Note that the technical scope of the present disclosure is not intended to be limited by the embodiments described below.

First Embodiment

Figure 1:
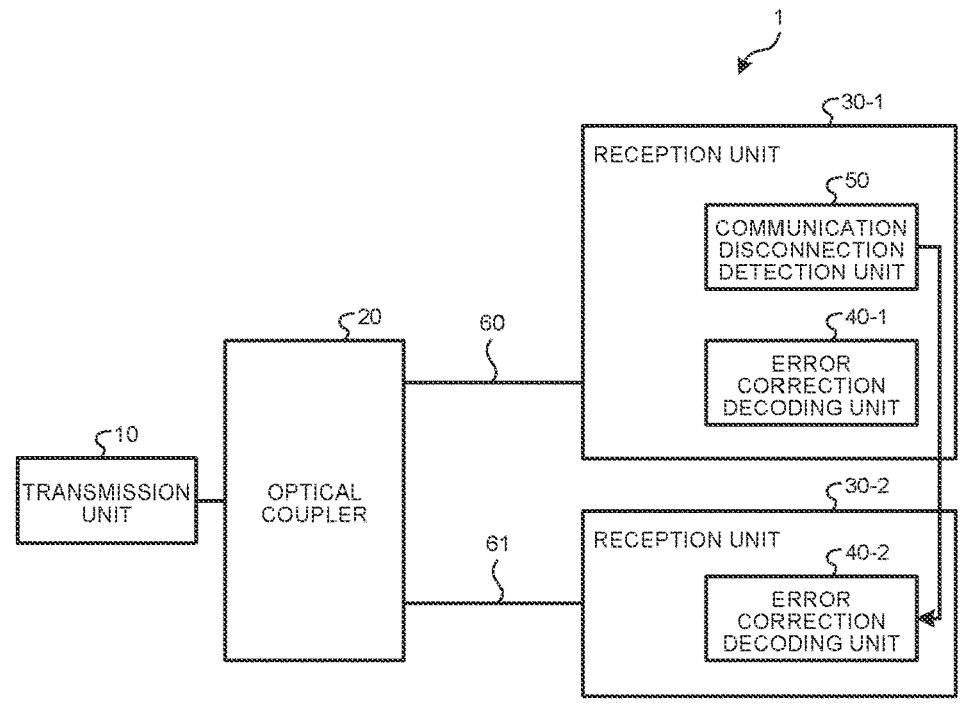
FIG. 1 is a diagram illustrating a configuration of an optical communication system according to a first embodiment.

FIG. 1 is a diagram illustrating a configuration of an optical communication system 1 according to a first embodiment. The optical communication system 1 includes a transmission unit 10, an optical coupler 20, which functions as an optical branching unit that branches an optical signal output by the transmission unit 10, and multiple reception units 30-1 and 30-2, which receive respective optical signals obtained by branching by the optical coupler 20. The reception unit 30-1 is an active system, which operates during normal operation. The reception unit 30-2 is a standby system, which is in a standby state during normal operation. The reception unit 30-1 of the active system includes an error correction decoding unit 40-1 and a communication disconnection detection unit 50. The reception unit 30-2 of the standby system includes an error correction decoding unit 40-2.

The multiple reception units 30-1 and 30-2 may be hereinafter referred to simply as reception unit 30 when no distinction needs to be made therebetween. Note that when a distinction is made between multiple components having similar functionalities, such components may be designated, in the following description, using different numbers suffixed to a common character with a hyphen inserted therebetween, such as designating the multiple reception units 30 the reception units 30-1 and 30-2, respectively.

The transmission unit 10 performs error correction encoding on information to be transmitted, and outputs the result of the error correction encoding in a form of an optical signal. The error correction code used by the transmission unit 10 is an error correction code that enables correction performance to be provided that is dependent on the number of iterations of decoding, such as for example, low density parity check code. The optical signal output by the transmission unit 10 is input to the optical coupler 20.

The optical coupler 20 is an optical branching unit that branches the optical signal output by the transmission unit 10 at an asymmetric branching ratio such as, for example, 1:10 (10 dB), rather than a symmetric branching ratio of 1:1 (3 dB). Among multiple optical signals obtained by branching, the optical signal corresponding to the highest branching ratio is herein referred to as first optical signal, and an optical signal corresponding to a non-highest branching ratio is herein referred to as second optical signal. In addition, the signal path for transmitting the first optical signal is herein referred to as first signal path 60, and the signal path for transmitting the second optical signal is herein referred to as second signal path 61. The first signal path 60 for transmitting the first optical signal corresponding to the highest branching ratio is connected to the reception unit 30-1 of the active system, and the second signal path 61 is connected to the reception unit 30-2 of the standby system.

The reception units 30 each receive at least one optical signal of the first optical signal and the second optical signal. Specifically, in the first embodiment, the reception unit 30-1 receives the first optical signal, and the reception unit 30-2 receives the second optical signal. Thus, the first optical signal and the second optical signal obtained by branching from a common optical signal output by the transmission unit 10 are received by different ones of the reception units 30.

The error correction decoding units 40 are provided correspondingly to the multiple respective reception units 30, and each have functionality to perform error correction decoding on the optical signal received by the corresponding one of the reception units 30. Specifically, the error correction decoding unit 40-1 is provided correspondingly to the reception unit 30-1 of the active system, and is capable of performing error correction decoding on the first optical signal received by the reception unit 30-1. The error correction decoding unit 40-2 is provided correspondingly to the reception unit 30-2 of the standby system, and is capable of performing error correction decoding on the second optical signal received by the reception unit 30-2. Each of the error correction decoding units 40 (hereinafter, simply the error correction decoding unit 40) has functionality to change the number of iterations of error correction decoding, and performs error correction decoding on an optical signal as many times as the number of iterations that has been set. A larger number of iterations provides higher error correction performance, but leads to a higher processing load, thereby resulting in higher power consumption. Thus, adjustment of the number of iterations enables adjustment of error correction performance, processing load, and power consumption. The error correction performance is desirably high enough to allow correct transmission of information, and the processing load and the power consumption are desirably kept low. The number of iterations is therefore desirably a lowest number of times that allows correct transmission of information, depending on the condition of the optical signal received by each corresponding one of the reception units 30. Thus, each of the multiple error correction decoding units 40 included in the optical communication system 1 performs error correction decoding with a smaller number of iterations on an optical signal to be processed, obtained at a higher branching ratio.

Note that the error correction decoding unit 40 may calculate and determine in advance the number of iterations based on the configuration of the optical communication system 1 and on characteristics of the components included in the optical communication system 1.

When detecting a disconnection of communication of the reception unit 30-1 of the active system, which receives the first optical signal, the communication disconnection detection unit 50 notifies, of the disconnection of communication, the error correction decoding unit 40-2 corresponding to the reception unit 30-2, which receives the second optical signal branched from the optical signal common to the first optical signal. In other words, the communication disconnection detection unit 50 detects a disconnection of communication of the reception unit 30-1 of the active system, and notifies, of the disconnection of communication, the reception unit 30-2 of the standby system, which receives the second optical signal originating from a same source as the source of the first optical signal received by the reception unit 30-1 of the active system. In addition, the communication disconnection detection unit 50 selects either the optical signal received by the reception unit 30-1 of the active system or the optical signal received by the reception unit 30-2 of the standby system, and outputs the result of the selection to the downstream stage.

The error correction decoding unit 40-1 corresponding to the reception unit 30-1 of the active system performs error correction decoding on the first optical signal during normal operation. The error correction decoding unit 40-2 corresponding to the reception unit 30-2 of the standby system is not in operation, that is, does not perform error correction decoding on the second optical signal, during normal operation in which no notification has been received of a disconnection of communication, but performs error correction decoding on the second optical signal when a notification of a disconnection of communication has been received. In this operation, a lower value can be assigned to the optical signal to be processed, obtained at a higher branching ratio, as the number of iterations of performing error correction decoding of each of the error correction decoding units 40-1 and 40-2. Specifically, the error correction decoding unit 40-2 performs error correction decoding on the second optical signal with a larger number of iterations than the number of iterations when the error correction decoding unit 40-1 performs error correction decoding on the first optical signal. The first optical signal received by the reception unit 30-1 of the active system corresponds to a higher branching ratio than the branching ratio of the second optical signal, and will thus be subjected to lower signal degradation. This allows the number of iterations to be lower than the number of iterations when the second optical signal is to be decoded.

As described above, the optical communication system 1 according to the first embodiment operates such that the optical coupler 20 branches, at an asymmetric branching ratio, the optical signal output by the transmission unit 10, and among the multiple optical signals obtained by branching, the first optical signal corresponding to the highest branching ratio is received by the reception unit 30-1 of the active system, and the second optical signal corresponding to a non-highest branching ratio is received by the reception unit 30-2 of the standby system. This enables the signal intensity of the optical signal in the active system to be preserved. In addition, among the multiple error correction decoding units 40, the error correction decoding unit 40-1, whose optical signal to be processed is the first optical signal, performs error correction decoding with a smaller number of iterations than the number of iterations used by the error correction decoding unit 40-2, whose optical signal to be processed is the second optical signal. This enables the optical communication system 1 to reduce power consumption in performing error correction decoding on the first optical signal. In addition, according to the optical communication system 1, the signal intensity of the second optical signal is lower than the signal intensity of the first optical signal, thereby requiring a larger number of iterations in performing error correction decoding, and hence resulting in higher power consumption in performing error correction decoding on the second optical signal in the standby system. However, when in operation, a typical communication system provides an uptime of 99.999% or higher in the active system. Accordingly, although power consumption temporarily increases during the time in which the system has switched over to the standby system, power consumption can be reduced over the entire operating time. Thus, power consumption can be reduced while reducing the error rate in the optical communication system 1, which is configured to form a redundant system by branching of an optical signal using the optical coupler 20.

Figure 2:
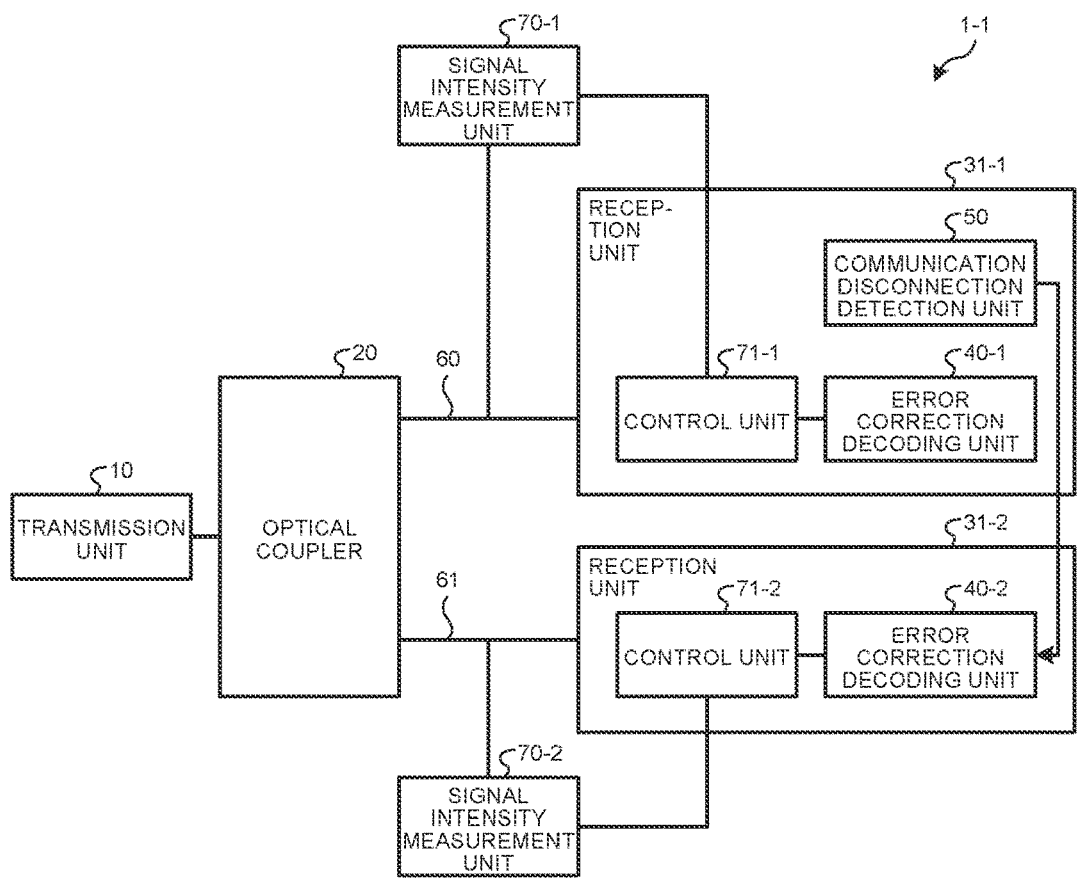
FIG. 2 is a diagram illustrating a configuration of an optical communication system according to a first variation of the first embodiment.

FIG. 2 is a diagram illustrating a configuration of an optical communication system 1-1 according to a first variation of the first embodiment. The optical communication system 1-1 includes the transmission unit 10, the optical coupler 20, reception units 31-1 and 31-2, and signal intensity measurement units 70-1 and 70-2. The reception unit 31-1 is connected to the first signal path 60 corresponding to the highest branching ratio. The reception unit 31-2 is connected to the second signal path 61 corresponding to a non-highest branching ratio. Among the components of the optical communication system 1-1, corresponding components in parts similar to those of the optical communication system 1 are indicated using like reference characters. Detailed description thereof is therefore omitted, and the following description is provided primarily with respect to differences from the optical communication system 1. In contrast to the optical communication system 1, in which the number of iterations to be used by the error correction decoding unit 40 is determined in advance, the optical communication system 1-1 has functionality to determine the number of iterations.

The reception unit 31-1 includes the error correction decoding unit 40-1, the communication disconnection detection unit 50, and a control unit 71-1, which determines the number of iterations of error correction decoding to be performed by the error correction decoding unit 40-1. The reception unit 31-2 includes the error correction decoding unit 40-2, and a control unit 71-2, which determines the number of iterations of error correction decoding to be performed by the error correction decoding unit 40-2. The signal intensity measurement unit 70 measures the signal intensity of the optical signal received by the corresponding one of the multiple reception units 31, and outputs the measurement value to the control unit 71. Specifically, the signal intensity measurement unit 70-1 measures the signal intensity of the first optical signal transmitted through the first signal path 60, and outputs the measurement value to the control unit 71-1. The signal intensity measurement unit 70-2 measures the signal intensity of the second optical signal transmitted through the second signal path 61, and outputs the measurement value to the control unit 71-2.

The control unit 71 determines the number of iterations of error correction decoding to be performed by the error correction decoding unit 40, based on the measurement value of the signal intensity output by the signal intensity measurement unit 70. The control unit 71 enables a smaller number of iterations to be used for a higher measurement value of the signal intensity.

As described in the first variation, determination of the number of iterations of error correction decoding to be performed by the error correction decoding unit 40 based on an actual measurement value of the signal intensity enables error correction decoding to be performed with a suitable number of iterations in accordance with the configuration and the state of the system.

Figure 3:
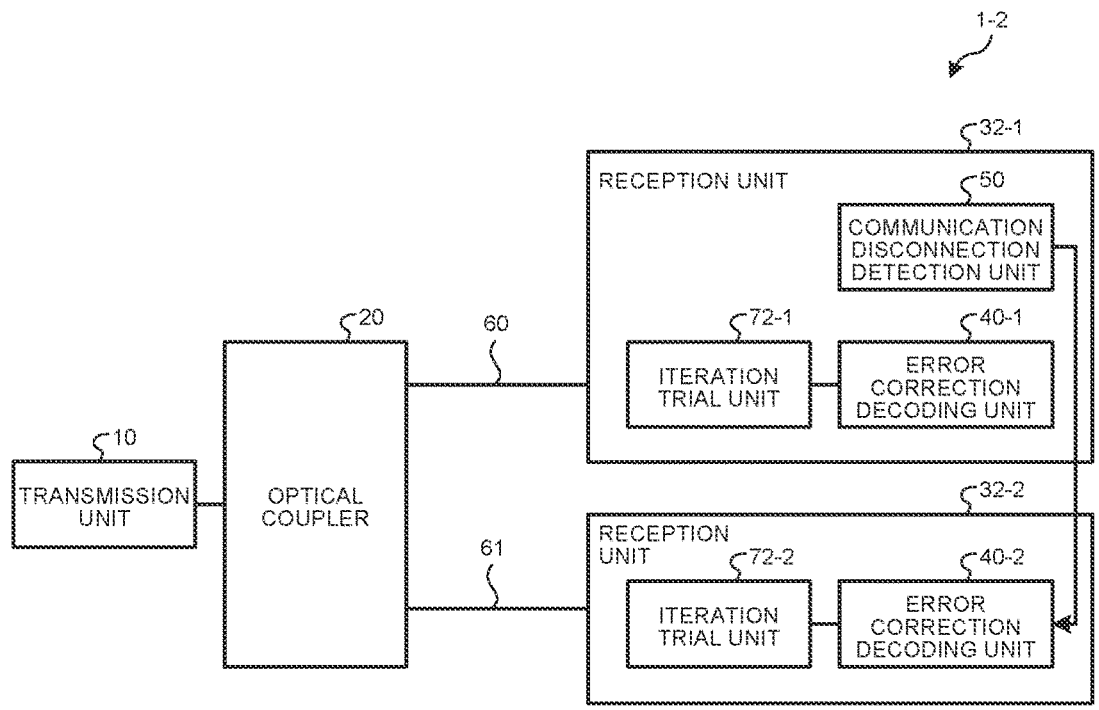
FIG. 3 is a diagram illustrating a configuration of an optical communication system according to a second variation of the first embodiment.

FIG. 3 is a diagram illustrating a configuration of an optical communication system 1-2 according to a second variation of the first embodiment. The optical communication system 1-2 includes the transmission unit 10, the optical coupler 20, and reception units 32-1 and 32-2. The reception unit 32-1 is connected to the first signal path 60 corresponding to the highest branching ratio, and the reception unit 32-2 is connected to the second signal path 61 corresponding to a non-highest branching ratio. The reception unit 32-1 of the active system includes the error correction decoding unit 40-1, the communication disconnection detection unit 50, and an iteration trial unit 72-1. The reception unit 32-2 of the standby system includes the error correction decoding unit 40-2 and an iteration trial unit 72-2. Among the components of the optical communication system 1-2, corresponding components in parts similar to those of the optical communication system 1 are indicated using like reference characters. Detailed description thereof is therefore omitted, and the following description is provided primarily with respect to differences from the optical communication system 1.

For example, upon startup, the iteration trial unit 72 causes the error correction decoding unit 40 to repeatedly perform error correction decoding experimentally with multiple different numbers of iterations, determines the number of iterations to be used by the error correction decoding unit 40 based on the results thereof, and stores the number of iterations determined. Specifically, the iteration trial unit 72 increases the number of iterations sequentially from the minimum settable value, and when a stable state is reached in which the result of the error correction decoding is no longer uncorrectable, stores the number of iterations at that time. The error correction decoding unit 40 thereafter performs error correction decoding with the number of iterations stored. In addition, the iteration trial unit 72 may periodically repeat the foregoing operation after the number of iterations is determined upon startup, and update the number of iterations to be used. Moreover, the iteration trial unit 72-2 of the reception unit 32-2 of the standby system, which receives the second optical signal, may determine the number of iterations when a disconnection of communication occurs in the reception unit 32-1 of the active system, and the circuit in the error correction decoding unit 40-2 of the standby system starts up.

As described in the second variation, determination of the number of iterations based on a result of actually performing the error correction decoding enables the error correction decoding to be performed with a suitable number of iterations in accordance with the configuration and the state of the system. Operation can indeed be performed depending on the state of the system even when the number of iterations is determined based on a value representing the condition of the optical signal to be processed such as the signal intensity, but determination of the number of iterations based on a result of actually performing the error correction decoding enables a more suitable number of iterations to be determined. This thus enables power consumption to be reduced while required error correction performance is maintained. In addition, even when the state of the system has changed, repeating the operation of determination of the number of iterations enables the number of iterations to be used taking into consideration the change in the state.

Figure 4:
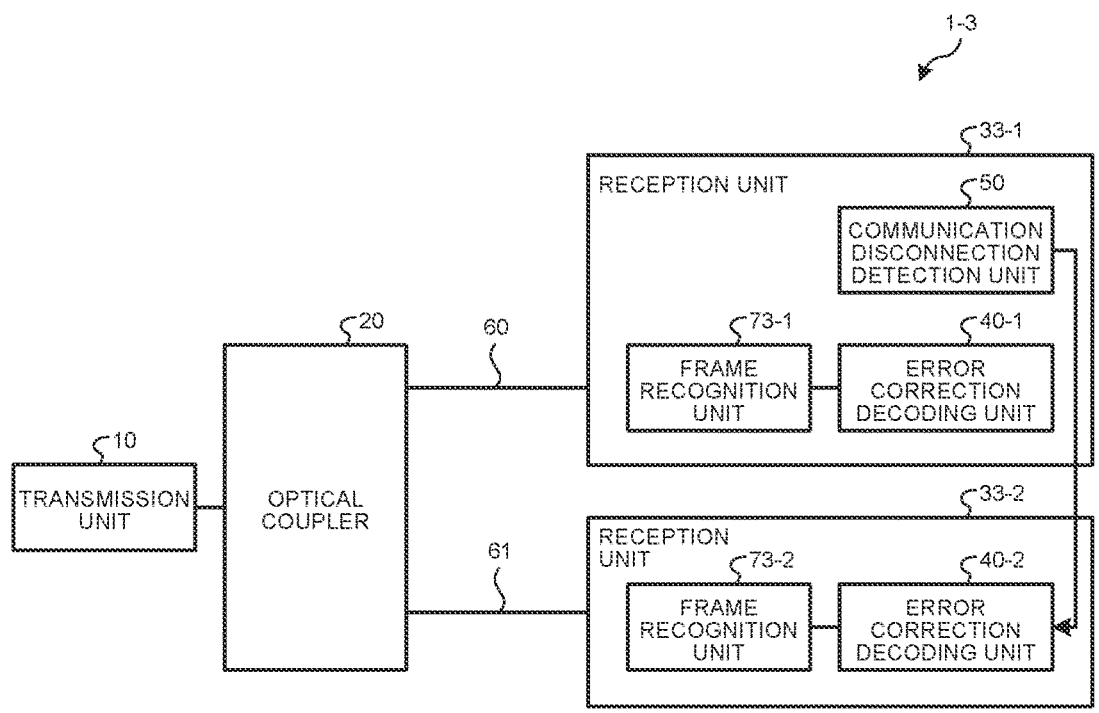
FIG. 4 is a diagram illustrating a configuration of an optical communication system according to a third variation of the first embodiment.

FIG. 4 is a diagram illustrating a configuration of an optical communication system 1-3 according to a third variation of the first embodiment. The optical communication system 1-3 includes the transmission unit 10, the optical coupler 20, and reception units 33-1 and 33-2. The reception unit 33-1 is connected to the first signal path 60 corresponding to the highest branching ratio, and the reception unit 33-2 is connected to the second signal path 61 corresponding to a non-highest branching ratio. The reception unit 33-1 of the active system includes the error correction decoding unit 40-1, the communication disconnection detection unit 50, and a frame recognition unit 73-1. The reception unit 33-2 of the standby system includes the error correction decoding unit 40-2 and a frame recognition unit 73-2. Among the components of the optical communication system 1-3, corresponding components in parts similar to those of the optical communication system 1 are indicated using like reference characters. Detailed description thereof is therefore omitted, and the following description is provided primarily with respect to differences from the optical communication system 1.

The optical communication system 1-3 is characterized in that the optical signal input to the optical coupler 20 is a signal generated by time-multiplexing of multiple optical signals from multiple transmitters supporting a passive optical network (PON) standardized in ITU-T G.984, IEEE 802.3ah, or the like.

The frame recognition unit 73 sets the number of iterations to be used by the error correction decoding unit 40 on a per received frame basis, based on information of the transmitter that has sent the optical signal, information representing control timing, and/or the like obtained from the frame header of the input optical signal and/or the like.

Note that an example has been described herein in which when a signal generated by time-multiplexing of multiple optical signals is received, the number of iterations to be used by the error correction decoding unit 40 is set on a per received frame basis. However, the error correction decoding unit 40 can skip the operation of setting the number of iterations on a per received frame basis by employing the largest number of iterations among multiple numbers of iterations suitable for the multiple respective optical signals included in the reception signal.

Figure 5:
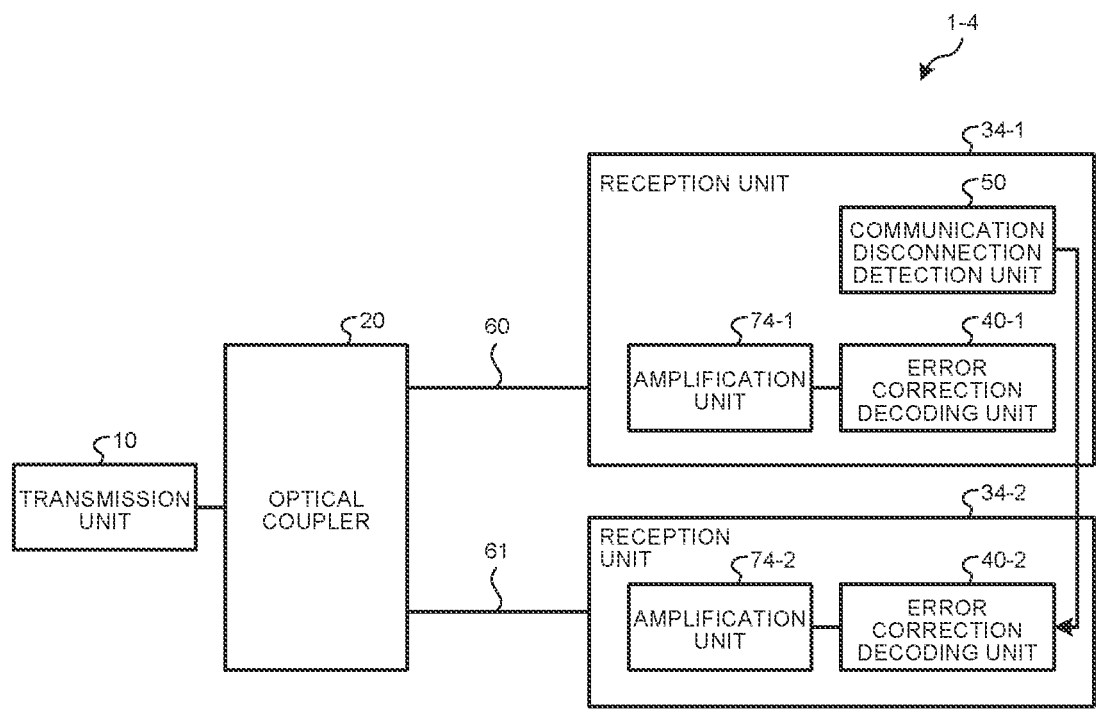
FIG. 5 is a diagram illustrating a configuration of an optical communication system according to a fourth variation of the first embodiment.

FIG. 5 is a diagram illustrating a configuration of an optical communication system 1-4 according to a fourth variation of the first embodiment. The optical communication system 1-4 includes the transmission unit 10, the optical coupler 20, and reception units 34-1 and 34-2. The reception unit 34-1 is connected to the first signal path 60 corresponding to the highest branching ratio, and the reception unit 34-2 is connected to the second signal path 61 corresponding to a non-highest branching ratio. The reception unit 34-1 of the active system includes the error correction decoding unit 40-1, the communication disconnection detection unit 50, and an amplification unit 74-1. The reception unit 34-2 of the standby system includes the error correction decoding unit 40-2 and an amplification unit 74-2. Among the components of the optical communication system 1-4, corresponding components in parts similar to those of the optical communication system 1 are indicated using like reference characters. Detailed description thereof is therefore omitted, and the following description is provided primarily with respect to differences from the optical communication system 1.

The amplification unit 74 amplifies the input optical signal with a gain adjusted to maintain constant intensity of the signal that is to be output, and outputs a signal obtained by amplification to the error correction decoding unit 40. The amplification unit 74 may include an optical amplifier for amplifying an optical signal, or include a photoelectric conversion element for performing photoelectric conversion on an optical signal, and an electrical amplification unit for amplifying the electrical signal obtained by the photoelectric conversion. The amplification unit 74 determines the number of iterations to be used in performing error correction decoding on the signal obtained by amplification, based on the gain obtained by the adjustment. Specifically, the amplification unit 74-1 amplifies the first optical signal, and outputs the resulting optical signal to the error correction decoding unit 40-1. In addition, the amplification unit 74-1 determines the number of iterations to be used by the error correction decoding unit 40-1, based on the gain used in amplification of the first optical signal. The amplification unit 74-2 amplifies the second optical signal, and outputs the resulting optical signal to the error correction decoding unit 40-2. In addition, the amplification unit 74-2 determines the number of iterations to be used by the error correction decoding unit 40-2, based on the gain used in amplification of the second optical signal. The error correction decoding unit 40 thus performs error correction decoding on the input signal as many times as the number of iterations that has been set based on the gain that has been used by the amplification unit 74.

Note that examples of the specific method to be used by the amplification unit 74 to determine the number of iterations based on the gain include a method in which the numbers of iterations associated with respective gains are stored in advance in a memory or the like, and the number of iterations associated with the value of the gain used in amplification is extracted from the information stored in the memory. Alternatively, the amplification unit 74 may obtain the number of iterations by assigning the gain that has been used in amplification to a calculation formula expressing the relationship between the gain and the number of iterations.

Although the optical communication systems 1 and 1-1 to 1-4 have been each described in which the optical coupler 20 branches the input optical signal into two optical signals, the optical coupler 20 may branch the input optical signal into three or more optical signals. In this case, a configuration may be used in which a multi-branching waveguide having, for example, a branching ratio of 10:1:1 is used, and the output corresponding to the highest branching ratio is connected to the active system, or a configuration may be used in which, for example, a 10:1 coupler is used to branch the optical signal, and the output corresponding to the higher branching ratio is connected to the active system, while the output corresponding to the lower branching ratio is further branched by a coupler, and the resulting outputs are connected to multiple standby systems. The former configuration causes the intensity of the optical signal input to the active system to decrease, even though gradually, with an increase in the number of standby systems. Thus, power consumption of the active system increases with an increase in the number of standby systems. In contrast, the latter configuration causes the optical signal input to the active system to have intensity independent of the number of standby systems, and is therefore advantageous in that power consumption of the active system will not increase even when the number of standby systems is increased to two or more.

Note that during a time in which the communication has been established in the reception units 30-1 to 34-1 of the active system, and no disconnection of communication has been detected, the reception units 30-2 to 34-2 of the standby system may cause the entire reception system to stop operation or cause only the error correction circuit to stop operation. When the entire reception system is caused to stop operation, switching over to the standby system will take a longer time, but power consumption can be lower, than when only the error correction circuit is caused to stop operation. When only the error correction circuit is caused to stop operation, power consumption will be higher, but the time required for switching over to the standby system can be shorter, than when the entire reception system is caused to stop operation.

Second Embodiment

The first embodiment has been described in which a single signal is made redundant, and whether a specific one of the reception units 30 is the active system or the standby system is predetermined. In contrast, a second embodiment will be described with respect to a configuration in which multiple signals are simultaneously made redundant using a time-multiplexing technique. Note that detailed description is omitted below for a configuration similar to the configuration of the first embodiment, and the following description is provided primarily with respect to differences from the first embodiment.

Figure 6:
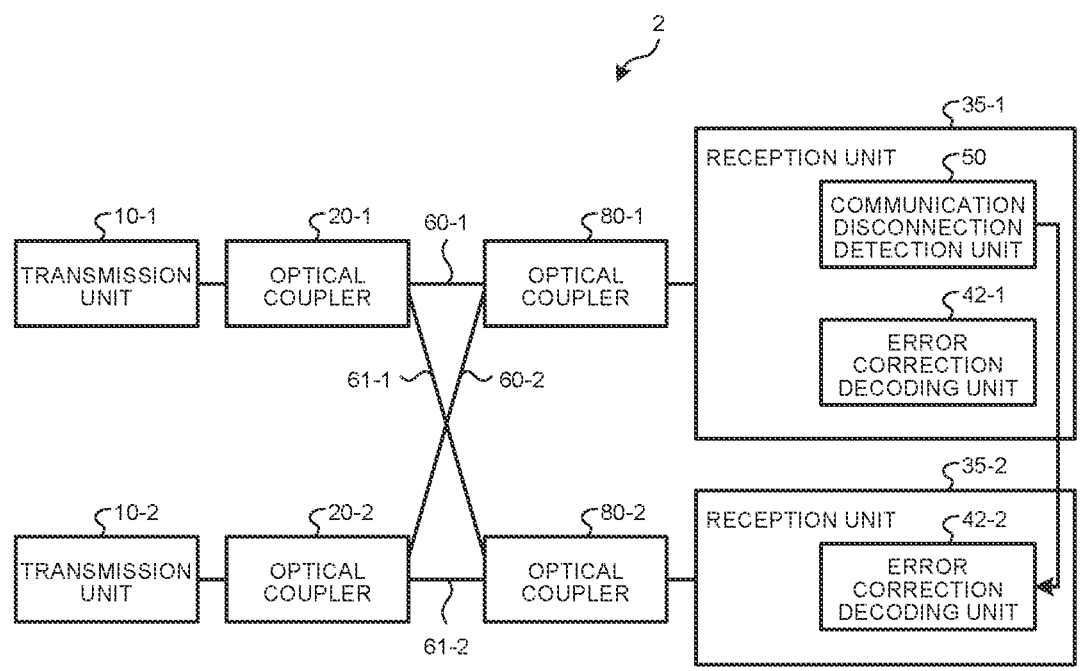
FIG. 6 is a diagram illustrating a configuration of an optical communication system according to a second embodiment.

FIG. 6 is a diagram illustrating a configuration of an optical communication system 2 according to the second embodiment. The optical communication system 2 includes multiple transmission units 10; multiple optical couplers 20, which are provided correspondingly to the multiple respective transmission units 10, and each function as an optical branching unit that branches an optical signal output by a corresponding one of the transmission units 10; multiple reception units 35; and optical couplers 80, which are provided correspondingly to the multiple respective reception units 35, and each function as an optical coupling unit that couples together multiple optical signals respectively output by the multiple optical couplers 20, and inputs a resulting optical signal into a corresponding one of the reception units 35.

Specifically, the optical communication system 2 includes two transmission units 10-1 and 10-2 and two reception units 35-1 and 35-2. An optical coupler 20-1 is provided correspondingly to the transmission unit 10-1, and functions as an optical branching unit to thus branch an optical signal output by the transmission unit 10-1 into two optical signals at an asymmetric branching ratio. A first signal path 60-1 corresponding to the higher branching ratio among the outputs of the optical coupler 20-1 is connected to an optical coupler 80-1. A second signal path 61-1 corresponding to the lower branching ratio among the outputs of the optical coupler 20-1 is connected to an optical coupler 80-2. An optical coupler 20-2 is provided correspondingly to the transmission unit 10-2, and functions as an optical branching unit to thus branch an optical signal output by the transmission unit 10-2 into two optical signals at an asymmetric branching ratio. A first signal path 60-2 corresponding to the higher branching ratio among the outputs of the optical coupler 20-2 is connected to the optical coupler 80-1. A second signal path 61-2 corresponding to the lower branching ratio among the outputs of the optical coupler 20-2 is connected to the optical coupler 80-2.

The transmission units 10-1 and 10-2 each provide, to information to be transmitted, an error correction code that enables correction performance to be provided that is dependent on the number of iterations of decoding, and output the result of error correction encoding in a form of an optical signal. The transmission units 10-1 and 10-2 respectively output optical signals to avoid overlapping of the burst output time period of the transmission unit 10-1 and the burst output time period of the transmission unit 10-2.

The optical coupler 80 couples together the multiple optical signals input, and inputs a resulting optical signal into a corresponding one of the reception units 35. Specifically, the optical coupler 80-1 receives a first optical signal originating from the transmission unit 10-1 and a first optical signal originating from the transmission unit 10-2. The signal that is input to the reception unit 35-1 thus includes multiple first optical signals. The optical coupler 80-2 receives a second optical signal originating from the transmission unit 10-1 and a second optical signal originating from the transmission unit 10-2. The signal that is input to the reception unit 35-2 thus includes multiple second optical signals. Accordingly, the reception unit 35-1 functions as the active system for the transmission unit 10-1, and also functions as the active system for the transmission unit 10-2.

In addition, the reception unit 35-2 functions as the standby system for the transmission unit 10-1, and also functions as the standby system for the transmission unit 10-2.

The reception unit 35-1 includes an error correction decoding unit 42-1 and the communication disconnection detection unit 50. The reception unit 35-2 includes an error correction decoding unit 42-2. The signal that is input to the reception unit 35-1 of the active system has intensity higher than the intensity of the signal that is input to the reception unit 35-2 of the standby system. This allows the number of iterations used by the error correction decoding unit 42-1 of the reception unit 35-1 to be less than the number of iterations used by the error correction decoding unit 42-2 of the reception unit 35-2. The error correction decoding unit 42-2 of the reception unit 35-2 functioning as the standby system is not in operation with no error correction decoding being performed during normal operation in which no notification of a disconnection of communication of the reception unit 35-1 has been received from the communication disconnection detection unit 50. The error correction decoding unit 42-2 operates to perform error correction decoding only when a notification has been received of a disconnection of communication of the reception unit 35-1.

Although FIG. 6 illustrates the optical communication system 2 including the single active-system reception unit 35-1 and the single standby-system reception unit 35-2, an optical communication system may include two or more standby-system reception units 35 also in the configuration in which multiple signals are simultaneously made redundant using a time-multiplexing technique. In this case, such configuration may be provided by increasing the number of branches to be generated by the optical couplers 20-1 and 20-2, or by connecting another optical coupler to the output corresponding to the lower branching ratio among the outputs of the optical couplers 20-1 and 20-2, which each branch an optical signal into two optical signals, to further branch the optical signal. The following description describes a configuration in which the optical couplers 20-1 and 20-2 each generate a larger number of branches in an optical communication system 2-1 including two standby-system reception units 35.

Figure 7:
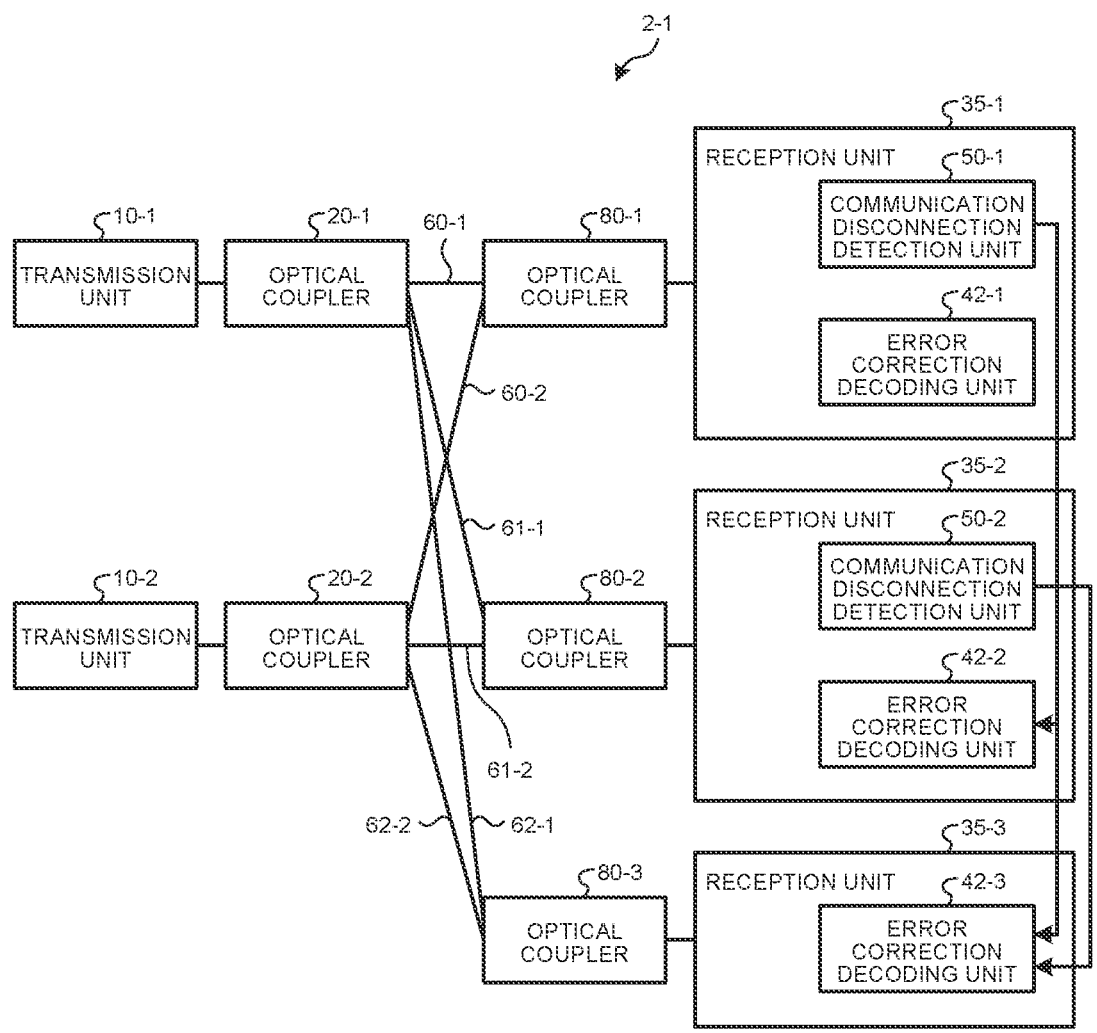
FIG. 7 is a diagram illustrating a configuration of an optical communication system according to a first variation of the second embodiment.

FIG. 7 is a diagram illustrating a configuration of the optical communication system 2-1 according to a first variation of the second embodiment. The optical communication system 2-1 includes the two transmission units 10-1 and 10-2; the optical couplers 20-1 and 20-2 provided correspondingly to the respective transmission units 10-1 and 10-2; three reception units 35-1, 35-2, and 35-3; and optical couplers 80-1, 80-2, and 80-3 provided correspondingly to the respective reception units 35-1, 35-2, and 35-3. The following description is provided primarily with respect to differences from the optical communication system 2.

The optical coupler 20 branches the input optical signal into three optical signals. In this operation, the optical coupler 20 branches the optical signal at an asymmetric branching ratio. The term "asymmetric" means that the branching ratio is not 1:1:1. For example, the optical couplers 20-1 and 20-2 each use a branching ratio of 10:1:1. Among the three optical signals obtained by branching by the optical coupler 20-1, the first optical signal corresponding to the highest branching ratio is input to the first signal path 60-1. The first signal path 60-1 is connected to the optical coupler 80-1. In addition, among the three optical signals obtained by branching by the optical coupler 20-1, the two second optical signals corresponding to the non-highest branching ratio are respectively input to the second signal paths 61-1 and 62-1. The second signal path 61-1 is connected to the optical coupler 80-2, and the second signal path 62-1 is connected to the optical coupler 80-3. Among the three optical signals obtained by branching by the optical coupler 20-2, the first optical signal corresponding to the highest branching ratio is input to the first signal path 60-2. The first signal path 60-2 is connected to the optical coupler 80-1. In addition, among the three optical signals obtained by branching by the optical coupler 20-2, the two second optical signals corresponding to the non-highest branching ratio are respectively input to the second signal paths 61-2 and 62-2. The second signal path 61-2 is connected to the optical coupler 80-2, and the second signal path 62-2 is connected to the optical coupler 80-3.

The optical coupler 80 couples together the multiple optical signals input, and outputs a resulting optical signal to a corresponding one of the reception units 35. The optical coupler 80-1 couples together the two first optical signals input via the first signal paths 60-1 and 60-2, and outputs a resulting optical signal to the reception unit 35-1. The optical coupler 80-2 couples together the two second optical signals input via the second signal paths 61-1 and 61-2, and outputs a resulting optical signal to the reception unit 35-2. The optical coupler 80-3 couples together the two second optical signals input via the second signal paths 62-1 and 62-2, and outputs a resulting optical signal to the reception unit 35-3.

The reception unit 35-1 includes the error correction decoding unit 42-1 and a communication disconnection detection unit 50-1. The reception unit 35-2 includes the error correction decoding unit 42-2 and a communication disconnection detection unit 50-2. The reception unit 35-3 includes an error correction decoding unit 42-3. When detecting a disconnection of communication of the reception unit 35-1, the communication disconnection detection unit 50-1 notifies each of the error correction decoding units 42-2 and 42-3 of the disconnection of communication. When detecting a disconnection of communication of the reception unit 35-2, the communication disconnection detection unit 50-2 notifies the error correction decoding unit 42-3 of the disconnection of communication. The error correction decoding unit 42-3 of the reception unit 35-3 functioning as the standby system is not in operation with no error correction decoding being performed during normal operation in which a notification has been received from neither the communication disconnection detection unit 50-1 nor 50-2, of a disconnection of communication of the reception unit 35-1 or 35-2. The error correction decoding unit 42-3 operates to perform error correction decoding only when a notification has been received of a disconnection of communication of both the reception units 35-1 and 35-2.

The error correction decoding unit 42-2 performs error correction decoding with a larger number of iterations than the number of iterations used by the error correction decoding unit 42-1. Note that in a case in which the optical signal transmitted through the second signal path 62-1 is branched at a branching ratio lower than the branching ratio used for the optical signal transmitted through the second signal path 61-1, the error correction decoding unit 42-3 may perform error correction decoding with a larger number of iterations than the number of iterations used by the error correction decoding unit 42-2. In a case in which the optical signal transmitted through the second signal path 62-1 is branched at a branching ratio equal to the branching ratio used for the optical signal transmitted through the second signal path 61-1, the error correction decoding unit 42-3 may also perform error correction decoding with the number of iterations equal to the number of iterations used by the error correction decoding unit 42-2.

When multiple reception units 35 are included as the standby system, as many optical couplers 80 as the number of the reception units 35 are installed, and the optical couplers 20 each provide as many branches as the number of the reception units 35 as illustrated in FIG. 7. The multiple outputs of the optical coupler 20 are connected to respective different ones of the optical couplers 80. This causes the multiple optical signals obtained by branching from a common optical signal to be received by respective different ones of the reception units 35. In addition, among the reception units 35 of the standby system, those other than the last one to be operated (in the example of FIG. 7, the reception units 35 other than the reception unit 35-3) include the communication disconnection detection unit 50. The communication disconnection detection unit 50 detects a disconnection of communication of the corresponding one of the reception units 35, and notifies, of the disconnection of communication, the reception unit or units 35 that will operate later than the reception unit 35 corresponding to such detection. Each of the reception units 35 of the standby system operates only when a notification of a disconnection of communication has been received for all of the reception units 35 that will operate earlier than that reception unit 35. Each of the reception units 35 of the standby system is not in operation when no disconnection of communication has been detected for a reception unit 35 among the reception units 35 that will operate earlier than that reception unit 35.

Note that when multiple reception units 35 are included as the standby system, the multiple second optical signals may be generated using a same branching ratio or different branching ratios. For example, in the example of FIG. 7, the branching ratio used for the second optical signal transmitted through the second signal path 61-1 may be the same as, or different from, the branching ratio used for the second optical signal transmitted through the second signal path 62-1. It is sufficient that the branching ratio used for the second optical signal transmitted through each of the second signal paths 61-1 and 62-1 be lower than the branching ratio used for the first optical signal transmitted through the first signal path 60-1.

Figures 8, 9:
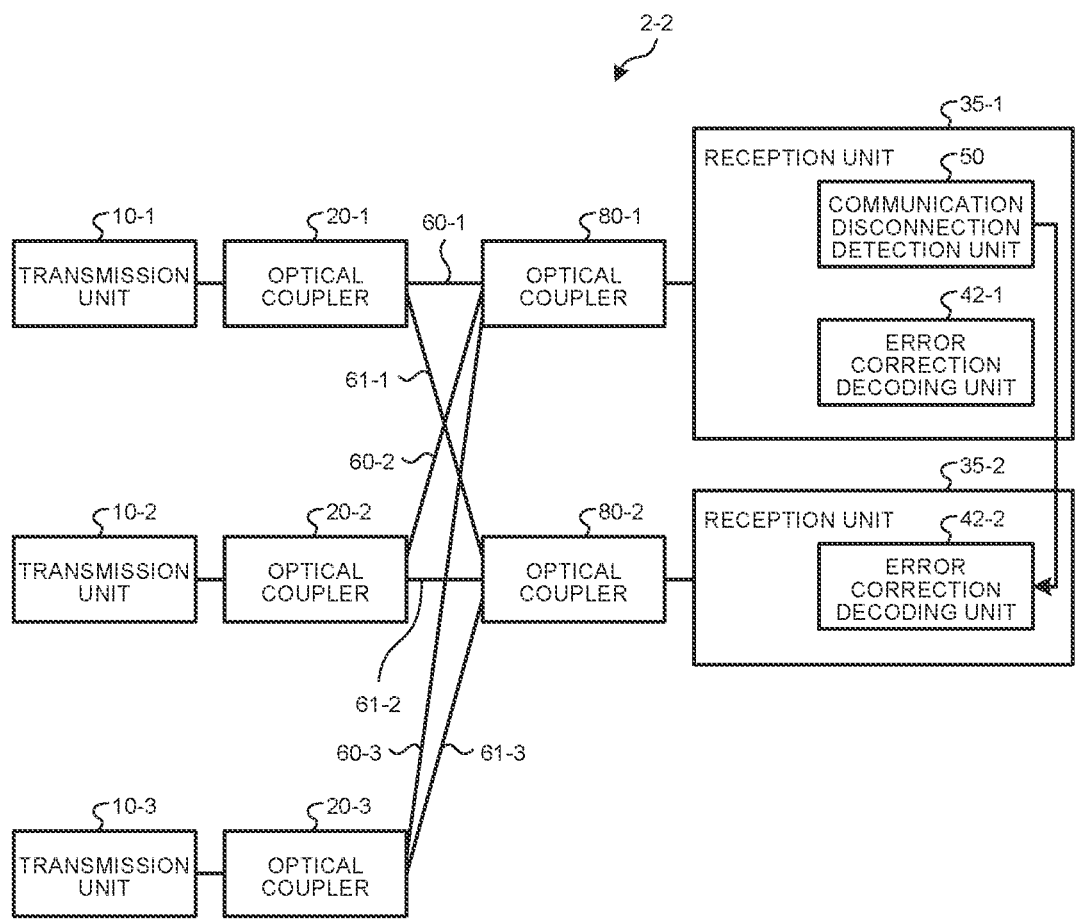
FIG. 8 is a diagram illustrating a configuration of an optical communication system according to a second variation of the second embodiment.
FIG. 9 is a diagram illustrating a first example of combination of the number of first systems and the number of second systems included in an optical communication system according to a third variation of the second embodiment.

FIG. 8 is a diagram illustrating a configuration of an optical communication system 2-2 according to a second variation of the second embodiment. The optical communication system 2-2 includes three transmission units 10-1 to 10-3; optical couplers 20-1 to 20-3 provided correspondingly to the respective transmission units 10-1 to 10-3; the two reception units 35-1 and 35-2; and the optical couplers 80-1 and 80-2 provided correspondingly to the respective reception units 35-1 and 35-2. The following description is provided primarily with respect to differences from the optical communication system 2.

When a signal path is shared by three transmission signals using a time-multiplexing technique, signal transmission cannot be simultaneously performed without causing congestion on the transmission signals even when three reception units 35 are provided, or by any combination of the signal paths. Use of at least one reception unit 35 is therefore sufficient, and the following description will be provided in the context of a configuration in which the optical communication system 2-2 includes the single reception unit 35-1 as the active system, and the single reception unit 35-2 as the standby system.

The transmission unit 10-3 outputs an optical signal to the optical coupler 20-3. The optical coupler 20-3 branches the input optical signal into two optical signals at an asymmetric branching ratio. The first optical signal corresponding to the higher branching ratio among the outputs of the optical coupler 20-3 is transmitted through a first signal path 60-3, which is connected to the optical coupler 80-1. The second optical signal corresponding to the lower branching ratio among the outputs of the optical coupler 20-3 is transmitted through a second signal path 61-3, which is connected to the optical coupler 80-2.

The optical coupler 80-1 couples together the three first optical signals transmitted through the first signal paths 60-1 to 60-3, and outputs a resulting optical signal to the reception unit 35-1. The optical coupler 80-2 couples together the three second optical signals transmitted through the second signal paths 61-1 to 61-3, and outputs a resulting optical signal to the reception unit 35-2.

The transmission units 10-1, 10-2, and 10-3 output optical signals to avoid overlapping of the burst output time periods thereof with each other. The reception signal received by each of the reception units 35-1 and 35-2 accordingly includes the transmission signals from the respective transmission units 10-1, 10-2, and 10-3 in a time division manner.

The second variation has been described with respect to an example of three transmission signals, but this also applies to a case of four or more transmission signals by providing as many optical couplers 20 as the number of transmission units 10, and connecting the output corresponding to the higher branching ratio among the outputs of each of the optical couplers 20 to the optical coupler 80-1, and connecting the output corresponding to the lower branching ratio among the outputs of each of the optical couplers 20 to the optical coupler 80-2. In this case, all the signals directed to the active system in the system are received by the single reception unit 35-1, and all the signals directed to the standby system in the system are received by the single reception unit 35-2. In this case, although the communication bandwidth of the overall system is reduced, the number of receivers can be lower, and power consumption can thus be reduced.

In addition, for example, combining the configuration of the optical communication system 2 illustrated in FIG. 6 with the configuration of the optical communication system 2-2 illustrated in FIG. 8 enables any number of transmission signals to be processed. A configuration involving two transmission signals such as those illustrated in FIGS. 6 and 7 is herein referred to as first system, and a configuration involving three transmission signals such as one illustrated in FIG. 8 is herein referred to as second system. The first system includes the two transmission units 10-1 and 10-2; the two optical couplers 20-1 and 20-2, which are optical branching units corresponding to the respective two transmission units 10-1 and 10-2; the multiple reception units 35; and the optical couplers 80, which are optical coupling units provided correspondingly to the multiple respective reception units 35. The second system includes the three transmission units 10-1 to 10-3; the three optical couplers 20-1 to 20-3, which are optical branching units corresponding to the respective three transmission units 10-1 to 10-3; the two reception units 35-1 and 35-2; and the two optical couplers 80-1 and 80-2, which are optical coupling units corresponding to the respective two reception units 35-1 and 35-2. A system involving N transmission signals, that is, a system including N transmission units 10, is herein referred to as an optical communication system 2-3 according to a third variation of the second embodiment. The optical communication system 2-3 includes at least one of the first system and the second system. The number of the first systems and the number of the second systems included in the optical communication system 2-3 will be as illustrated in FIG. 9 or FIG. 10, where N represents the number of transmission signals in the entire system.

FIG. 9 is a diagram illustrating a first example of combination of the number of the first systems and the number of the second systems included in the optical communication system 2-3 according to the third variation of the second embodiment. FIG. 10 is a diagram illustrating a second example of combination of the number of the first systems and the number of the second systems included in the optical communication system 2-3 according to the third variation of the second embodiment. The first example illustrated in FIG. 9 preferentially uses the first system involving two transmission signals, while the second example illustrated in FIG. 10 preferentially uses the second system involving three transmission signals.

In the first example illustrated in FIG. 9, N is an integer greater than or equal to 2. When N is an even number, the optical communication system 2-3 includes as many first systems as the quotient obtained by dividing N by 2. The number of the second systems in this case is 0. When N is an odd number, the optical communication system 2-3 includes one second system and as many first systems as the quotient obtained by dividing, by 2, the difference obtained by subtracting 3 from N. As illustrated in FIG. 9, preferential use of the first system enables a larger amount of communication bandwidth to be available.

In the second example illustrated in FIG. 10, N is an integer greater than or equal to 3. When N is a multiple of 3, the optical communication system 2-3 includes as many second systems as the quotient obtained by dividing N by 3. The number of the first systems in this case is 0. When N is "a multiple of 3"+1, the optical communication system 2-3 includes two first systems and as many second systems as the quotient obtained by dividing, by 3, the difference obtained by subtracting 4 from N. When N is "a multiple of 3"+2, the optical communication system 2-3 includes one first system and as many second systems as the quotient obtained by dividing, by 3, the difference obtained by subtracting 2 from N. As illustrated in FIG. 10, preferential use of the second system allows power consumption to be reduced. The combination of the number of the first systems and the number of the second systems can be determined depending on requirements for the optical communication system 2-3.

As described above, the optical communication systems 2, 2-1, 2-2, and 2-3 according to the second embodiment also each operate such that the optical coupler 20 branches, at an asymmetric branching ratio, the optical signal output by the transmission unit 10, and among the multiple optical signals obtained by branching, the first optical signal corresponding to the highest branching ratio is received by the reception unit 35-1 of the active system, and the second optical signal or one of the second optical signals corresponding to the non-highest branching ratio is received by the reception unit 35-2 of the standby system. In the optical communication system 2-1, a second optical signal is also received by the reception unit 35-3 of the standby system. This enables the signal intensity of the optical signal in the active system to be preserved. In addition, among the multiple error correction decoding units 42, the error correction decoding unit 42-1, whose optical signal to be processed is the first optical signal, performs error correction decoding with a smaller number of iterations than the numbers of iterations used by the error correction decoding units 42-2 and 42-3, whose optical signals to be processed are the second optical signals. This enables the optical communication systems 2, 2-1, 2-2, and 2-3 to reduce power consumption in performing error correction decoding on the first optical signal. In addition, according to the optical communication systems 2, 2-1, 2-2, and 2-3, the signal intensity of a second optical signal is lower than the signal intensity of the first optical signal, thereby resulting in higher power consumption in performing error correction decoding on a second optical signal in the standby system. However, when in operation, a typical communication system provides an uptime of 99.999% or higher in the active system. Accordingly, although power consumption temporarily increases during the time in which the system has switched over to the standby system, power consumption can be reduced over the entire operating time. Thus, power consumption can be reduced while reducing the error rate in the optical communication systems 2, 2-1, 2-2, and 2-3, which are each configured to form a redundant system by branching of an optical signal using the optical couplers 20.

Moreover, use of a combination of the first system involving two transmission signals and the second system involving three transmission signals enables a redundant system to be configured for any number of transmission signals.

Third Embodiment

The foregoing second embodiment has been described with respect to a configuration in which multiple signals are simultaneously made redundant using a time-multiplexing technique. However, in view of equal burst time assignment to the transmission signals, use of a configuration involving three transmission signals will impose a limitation on the burst time assignment to each transmission signal to up to a third ($\frac{1}{3}$), i.e., about 33%, of the total burst time at a maximum. A third embodiment will be described with respect to a configuration that allows a burst time period of 33% or longer relative to the total burst time period to be assigned to all of the transmission signals when five or more transmission signals are involved. Detailed description is omitted below for a configuration and an operation similar to those of the first and second embodiments, and the following description is provided primarily with respect to differences from the first and second embodiments.

Figure 11:
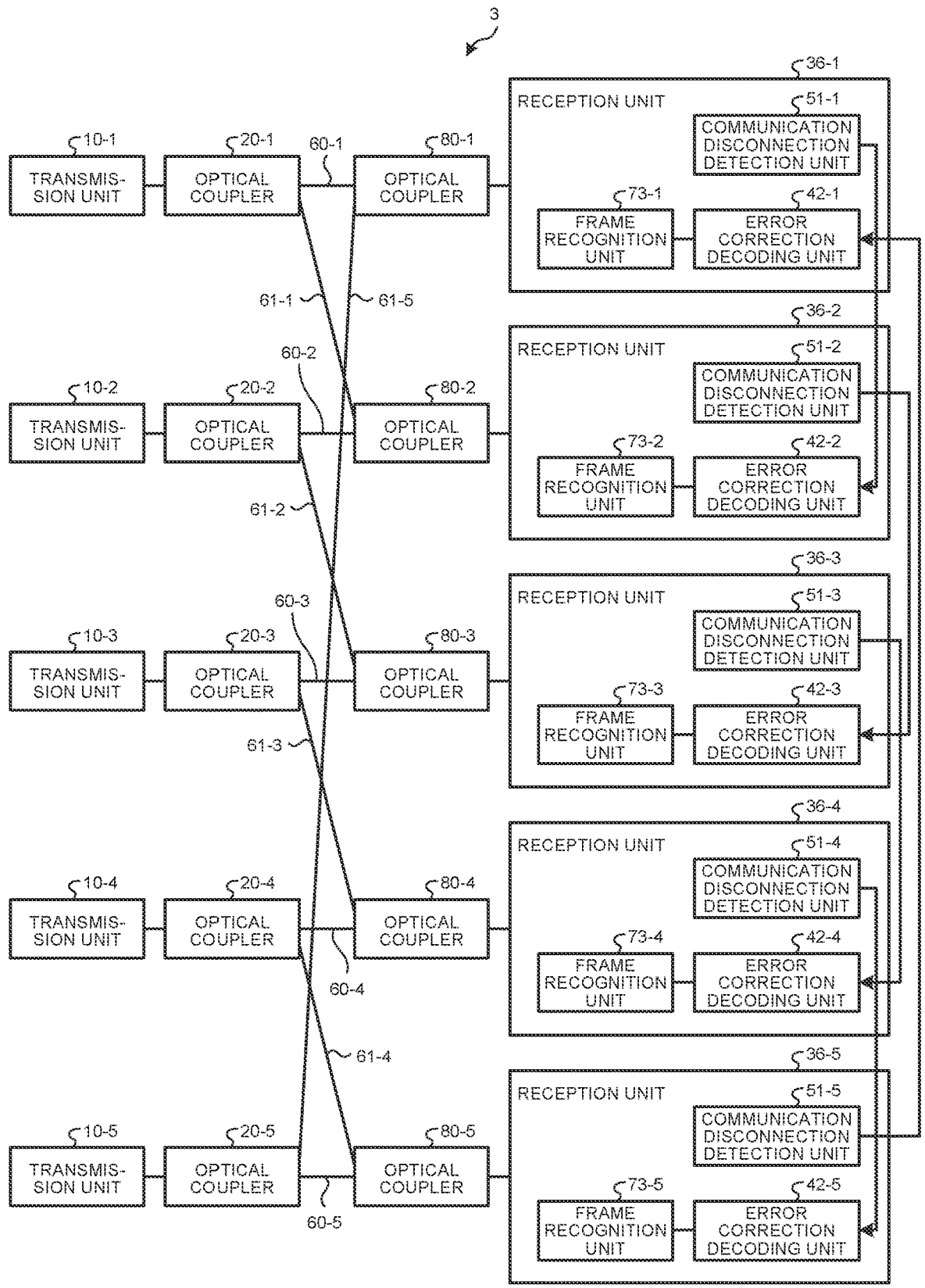
FIG. 11 is a diagram illustrating a configuration of an optical communication system according to a third embodiment.

FIG. 11 is a diagram illustrating a configuration of an optical communication system 3 according to the third embodiment. The optical communication system 3 includes transmission units 10-1 to 10-5; optical couplers 20-1 to 20-5, which are optical branching units provided correspondingly to the respective transmission units 10-1 to 10-5; reception units 36-1 to 36-5; and optical couplers 80-1 to 80-5, which are optical coupling units provided correspondingly to the respective reception units 36-1 to 36-5. The number of the reception units 36 is an integer multiple of the number of the transmission units 10. In the example illustrated in FIG. 11, these numbers are the same, meaning that the optical communication system 3 includes a same number of the reception units 36 and the transmission units 10.

In the second embodiment, the reception unit 35-1 receives optical signals directed to the active system, and the reception unit 35-2 receives optical signals directed to the standby system. In contrast, in the third embodiment, each of the multiple reception units 36 receives an optical signal directed to the active system and an optical signal directed to the standby system. In this operation, the first optical signal and the second optical signal obtained by branching from a common optical signal are received by different ones of the reception units 36.

The optical coupler 20 branches the optical signal output by a corresponding one of the transmission units 10 into two optical signals. The outputs of the optical coupler 20 are connected to two adjacent ones of the optical couplers 80. Specifically, the first signal path 60-1 for transmitting the first optical signal corresponding to the higher branching ratio among the outputs of the optical coupler 20-1 is connected to the optical coupler 80-1, and the second signal path 61-1 for transmitting the second optical signal corresponding to the lower branching ratio among the outputs of the optical coupler 20-1 is connected to the optical coupler 80-2. The first signal path 60-2 for transmitting the first optical signal corresponding to the higher branching ratio among the outputs of the optical coupler 20-2 is connected to the optical coupler 80-2, and the second signal path 61-2 for transmitting the second optical signal corresponding to the lower branching ratio among the outputs of the optical coupler 20-2 is connected to the optical coupler 80-3. The first signal path 60-3 for transmitting the first optical signal corresponding to the higher branching ratio among the outputs of the optical coupler 20-3 is connected to the optical coupler 80-3, and the second signal path 61-3 for transmitting the second optical signal corresponding to the lower branching ratio among the outputs of the optical coupler 20-3 is connected to the optical coupler 80-4. A first signal path 60-4 for transmitting the first optical signal corresponding to the higher branching ratio among the outputs of the optical coupler 20-4 is connected to the optical coupler 80-4, and a second signal path 61-4 for transmitting the second optical signal corresponding to the lower branching ratio among the outputs of the optical coupler 20-4 is connected to the optical coupler 80-5. A first signal path 60-5 for transmitting the first optical signal corresponding to the higher branching ratio among the outputs of the optical coupler 20-5 is connected to the optical coupler 80-5, and a second signal path 61-5 for transmitting the second optical signal corresponding to the lower branching ratio among the outputs of the optical coupler 20-5 is connected to the optical coupler 80-1. That is, the optical couplers 20-1 to 20-5 and the optical couplers 80-1 to 80-5 are physically connected to each other in a ring formation through the first signal paths 60-1 to 60-5 and through the second signal paths 61-1 to 61-5 to thus geometrically form a ring topology.

Forming a ring topology as described above allows the two optical signals obtained by branching from an optical signal output by each of the transmission units 10 to be received by respective different ones of the reception units 36, and can prevent different ones of the multiple transmission units 10 from being connected to a same one of the reception units 36 that functions as the standby system. For simplicity of illustration, the first optical signal obtained by branching the optical signal output by a corresponding one of the transmission units 10, by a corresponding one of the optical couplers 20 is hereinafter referred to as first optical signal from the transmission unit 10. A similar expression applies to the second optical signal. The foregoing connection configuration causes each of the optical couplers 80-1 to 80-5 to be connected with two of the optical couplers 20 to thus couple together the first optical signal output by one of the two optical couplers 20 and the second optical signal output by the other one of the two optical couplers 20. Each of the optical couplers 80-1 to 80-5 then outputs the resulting optical signal to the corresponding one of the reception units 36-1 to 36-5. Accordingly, the reception unit 36-1 receives the first optical signal directed to the active system output from the transmission unit 10-1 and the second optical signal directed to the standby system output from the transmission unit 10-5. The reception unit 36-2 receives the first optical signal directed to the active system output from the transmission unit 10-2 and the second optical signal directed to the standby system output from the transmission unit 10-1. The reception unit 36-3 receives the first optical signal directed to the active system output from the transmission unit 10-3 and the second optical signal directed to the standby system output from the transmission unit 10-2. The reception unit 36-4 receives the first optical signal directed to the active system output from the transmission unit 10-4 and the second optical signal directed to the standby system output from the transmission unit 10-3. The reception unit 36-5 receives the first optical signal directed to the active system output from the transmission unit 10-5 and the second optical signal directed to the standby system output from the transmission unit 10-4.

Each of the multiple reception units 36 includes the error correction decoding unit 42, a communication disconnection detection unit 51, and the frame recognition unit 73. When detecting a disconnection of communication of the corresponding one of the reception units 36, the communication disconnection detection unit 51 notifies, of the disconnection of communication, the error correction decoding unit 42 of the reception unit 36 receiving the second optical signal branched from the optical signal common to the first optical signal received by the corresponding one of the reception units 36. Specifically, when detecting a disconnection of communication of the reception unit 36-1, the communication disconnection detection unit 51-1 notifies the error correction decoding unit 42-2 of the disconnection of communication. When detecting a disconnection of communication of the reception unit 36-2, the communication disconnection detection unit 51-2 notifies the error correction decoding unit 42-3 of the disconnection of communication. When detecting a disconnection of communication of the reception unit 36-3, the communication disconnection detection unit 51-3 notifies the error correction decoding unit 42-4 of the disconnection of communication. When detecting a disconnection of communication of the reception unit 36-4, the communication disconnection detection unit 51-4 notifies the error correction decoding unit 42-5 of the disconnection of communication. When detecting a disconnection of communication of the reception unit 36-5, the communication disconnection detection unit 51-5 notifies the error correction decoding unit 42-1 of the disconnection of communication.

The frame recognition unit 73 determines the number of iterations to be used by the corresponding one of the error correction decoding units 42 for each frame of a reception signal. The error correction decoding unit 42 performs error correction decoding on the first optical signal directed to the active system as long as no disconnection of communication occurs in the corresponding one of the reception units 36. With regard to the second optical signal directed to the standby system, the error correction decoding unit 42 discards the frame, and causes the error correction circuit to stop operation when no disconnection of communication is notified from the corresponding one of the communication disconnection detection units 51, and when a notification of a disconnection of communication is received, the error correction decoding unit 42 starts the error correction circuit to perform error correction decoding on the second optical signal. In this operation, the error correction decoding unit 42 performs error correction decoding as many times as the number of iterations determined by the frame recognition unit 73. Note that although described as including the frame recognition unit 73, the optical communication system 3 may include the signal intensity measurement unit 70 and the control unit 71 such as those illustrated in FIG. 2, or may include the amplification unit 74 such as one illustrated in FIG. 5. What is needed is a capability of determining the number of iterations to be used by the corresponding one of the error correction decoding units 42, for each frame of a reception signal.

Figure 12:
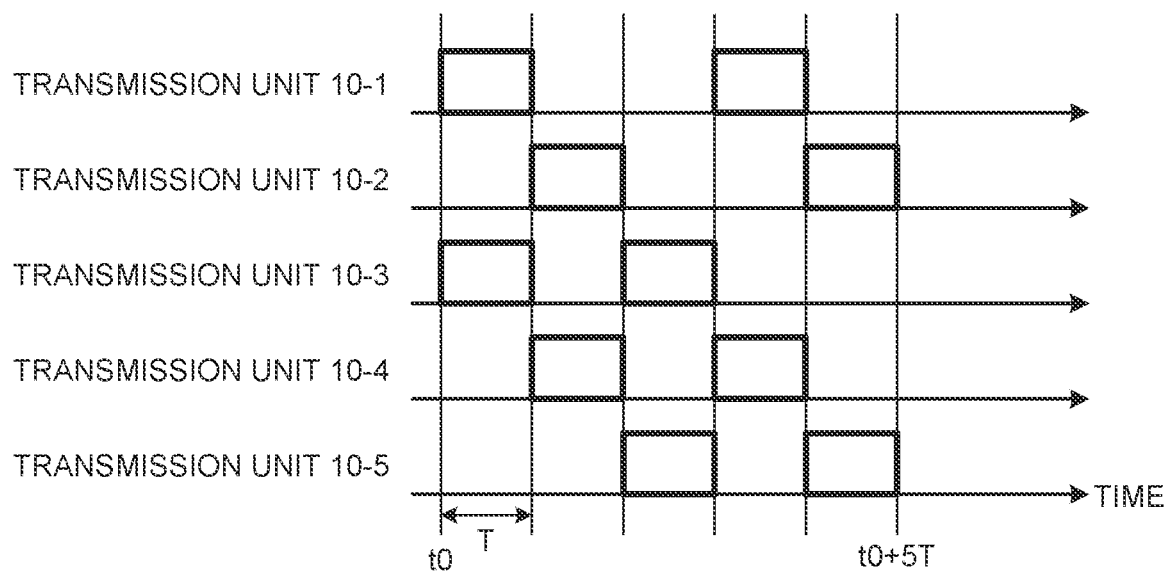
FIG. 12 is a diagram illustrating transmission time spans of the transmission units of the optical communication system illustrated in FIG. 11.

The transmission unit 10 performs, on information to be transmitted, error correction encoding that enables correction performance to be provided that is dependent on the number of iterations of decoding, and outputs an optical signal to avoid overlapping of the time periods of inputting the first optical signal and the second optical signal that are to be input to a same one of the optical couplers 80, to that optical coupler 80. In the example illustrated in FIG. 11, the transmission units 10 each output a burst optical signal during a time period outside burst time spans of channels adjacent to the applicable channel. For example, the transmission units 10 use transmission time spans as illustrated in FIG. 12. FIG. 12 is a diagram illustrating transmission time spans used by the transmission units 10-1 to 10-5 of the optical communication system 3 illustrated in FIG. 11.

In the example of FIG. 12, the transmission unit 10-1 outputs a burst optical signal during a time span from time t0 to time t0+T and during a time span from time t0+3T to time t0+4T. The transmission unit 10-2 outputs a burst optical signal during a time span from time t0+T to time t0+2T and during a time span from time t0+4T to time t0+5T. The transmission unit 10-3 outputs a burst optical signal during a time span from time t0 to time t0+T and during a time span from time t0+2T to time t0+3T. The transmission unit 10-4 outputs a burst optical signal during a time span from time t0+T to time t0+2T and during a time span from t0+3T to t0+4T. The transmission unit 10-5 outputs a burst optical signal during a time span from time t0+2T to time t0+3T and during a time span from time t0+4T to time t0+5T. The transmission units 10-1 to 10-5 can output a burst optical signal in a similar manner also after time t0+5T. This technique allows all the transmission units 10 to assign 40% of the total burst time period.

Let N denote the number of transmission signals in the optical communication system 3. When N is an odd number, the number of transmission signals transmittable in a same time span without causing congestion is (N−1)/2. Thus, a value (1−1/N)/2, obtained by dividing the foregoing value by N, of the total burst time period can be assigned to all of the transmission signals. With an increase in N, this ratio increases, and hence a longer burst time period can be assigned. In addition, when N is an even number, the number of transmission signals transmittable in a same time span without causing congestion is N/2. Thus, 50% of the total burst time period can be assigned to all of the transmission signals.

As described above, the optical communication system 3 according to the third embodiment operates such that the optical coupler 20 branches, at an asymmetric branching ratio, the optical signal output by the transmission unit 10, and that the multiple optical signals obtained by branching from a common optical signal are received by respective different ones of the reception units 36. Each of the reception units 36 functions as the active system for the first optical signal, and the error correction decoding unit 42 thereof performs error correction decoding on the first optical signal as long as no disconnection of communication occurs in that reception unit 36. In addition, each of the reception units 36 functions as the standby system for the second optical signal, and the error correction decoding unit 42 thereof does not perform error correction decoding on the second optical signal during normal operation, but performs error correction decoding on the second optical signal when a notification has been received of a disconnection of communication of the reception unit 36 that receives the first optical signal branched from an optical signal common to the second optical signal to be processed. In this operation, the error correction decoding unit 42 performs error correction decoding on the first optical signal as many times as a number of iterations less than the number of iterations to be used for performing error correction decoding on the second optical signal. This enables the optical communication system 3 to reduce power consumption in performing error correction decoding on the first optical signal, and to also reduce the error rate. The number of iterations of performing error correction decoding is preferably adjusted to be higher for lower intensity of the optical signal processed, depending on the branching ratio used for the optical signal received. Use of a fixed number of iterations that enables reduction in the error rate for all the optical signals will wastefully increase power consumption. On the contrary, use of a suitable number of iterations enables reduction in power consumption in combination with reduction in the error rate.

In addition, the optical communication system 3 is configured in a ring topology in which the optical couplers 20 and the optical couplers 80 are arranged, and connected to each other, in a ring formation. Each of the optical couplers 80 couples together the first optical signal, output by one of the two optical couplers 20 connected thereto, and the second optical signal, output by the other one, and outputs a resulting optical signal to a corresponding one of the reception units 36. Each of the multiple transmission units 10 outputs an optical signal to avoid overlapping of the time periods of inputting the first optical signal and the second optical signal that are to be input to a same one of the optical couplers 80, to that optical coupler 80. Use of such configuration provides a lower proportion of transmission signals that are involved in congestion in a same time span, with an increase in the total number of transmission signals. This enables a longer burst output time period to be assigned to all the transmission signals than that in a configuration such as one illustrated in FIG. 8 in which three transmission signals are each branched by the optical coupler 20 into two optical signals, and the resulting two optical signals are respectively received by the single reception unit 35-1 of the active system and the single reception unit 35-2 of the standby system.

Figure 13:
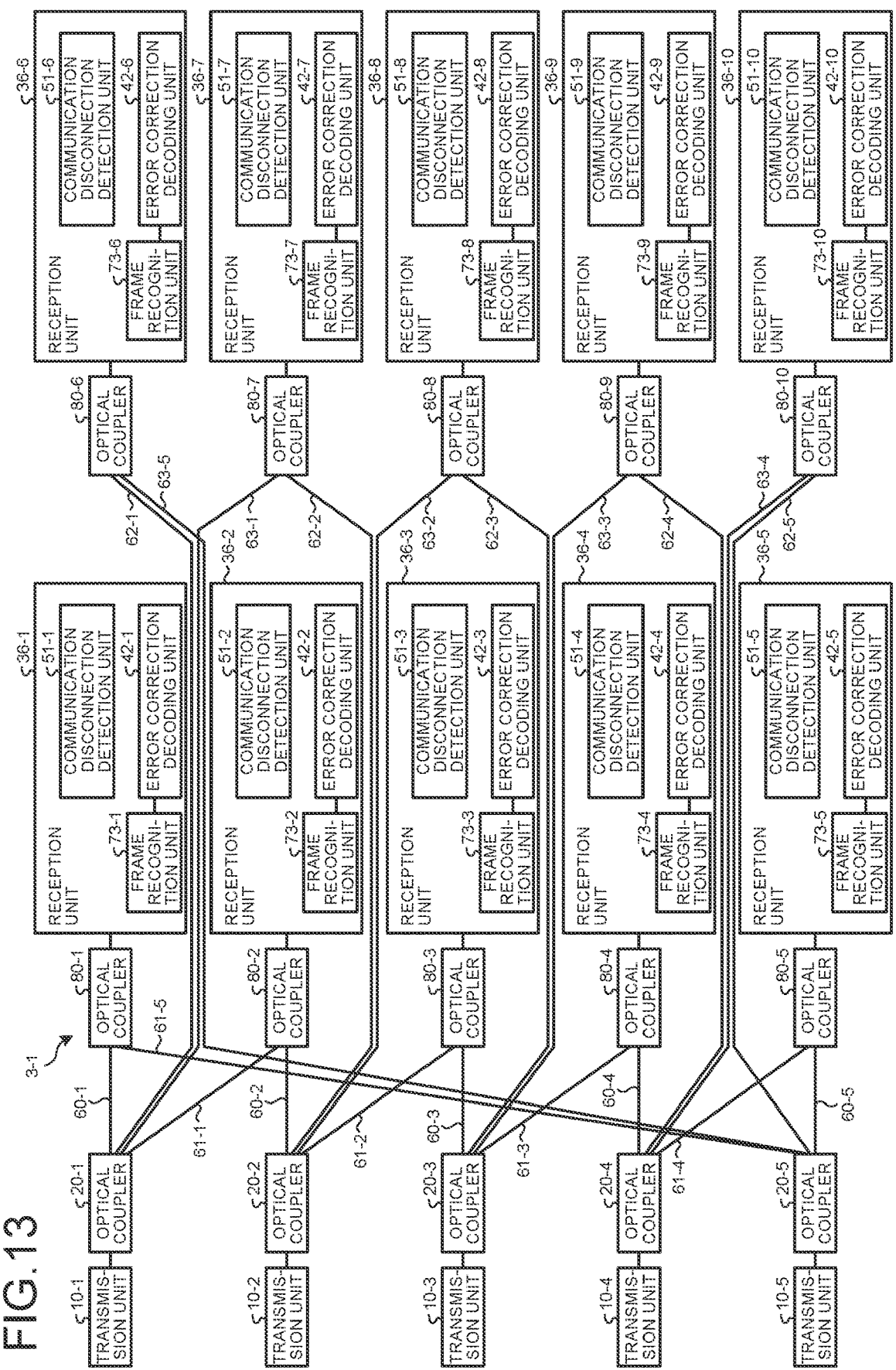
FIG. 13 is a diagram illustrating a configuration of an optical communication system according to a variation of the third embodiment.

FIG. 13 is a diagram illustrating a configuration of an optical communication system 3-1 according to a variation of the third embodiment. The optical communication system 3-1 includes the transmission units 10-1 to 10-5, the optical couplers 20-1 to 20-5, optical couplers 80-1 to 80-10, and reception units 36-1 to 36-10. The reception units 36-1 to 36-10 respectively include error correction decoding units 42-1 to 42-10, communication disconnection detection units 51-1 to 51-10, and frame recognition units 73-1 to 73-10.

The optical coupler 20 branches the optical signal output by the transmission unit 10 into four optical signals at an asymmetric branching ratio. The optical coupler 20 outputs one first optical signal and three second optical signals. Among the outputs of the optical coupler 20-1, the first signal path 60-1 is connected to the optical coupler 80-1, the second signal path 61-1 is connected to the optical coupler 80-2, the second signal path 62-1 is connected to the optical coupler 80-6, and a second signal path 63-1 is connected to the optical coupler 80-7. Among the outputs of the optical coupler 20-2, the first signal path 60-2 is connected to the optical coupler 80-2, the second signal path 61-2 is connected to the optical coupler 80-3, the second signal path 62-2 is connected to the optical coupler 80-7, and a second signal path 63-2 is connected to the optical coupler 80-8. Among the outputs of the optical coupler 20-3, the first signal path 60-3 is connected to the optical coupler 80-3, the second signal path 61-3 is connected to the optical coupler 80-4, a second signal path 62-3 is connected to the optical coupler 80-8, and a second signal path 63-3 is connected to the optical coupler 80-9. Among the outputs of the optical coupler 20-4, the first signal path 60-4 is connected to the optical coupler 80-4, the second signal path 61-4 is connected to the optical coupler 80-5, a second signal path 62-4 is connected to the optical coupler 80-9, and a second signal path 63-4 is connected to the optical coupler 80-10. Among the outputs of the optical coupler 20-5, the first signal path 60-5 is connected to the optical coupler 80-5, the second signal path 61-5 is connected to the optical coupler 80-1, a second signal path 62-5 is connected to the optical coupler 80-10, and a second signal path 63-5 is connected to the optical coupler 80-6. That is, the optical couplers 20 and the optical couplers 80 together form a ring topology with the first signal paths 60-1 to 60-5 and with the second signal paths 61-1 to 61-5, 62-1 to 62-5, and 63-1 to 63-5.

The four optical signals output by the optical coupler 20 are received by respective different ones of the reception units 36. In addition, the reception units 36-1 to 36-5 each receive the first optical signal and a second optical signal, and the reception units 36-6 to 36-10 each receive two different second optical signals.

Each of the reception units 36-1 to 36-10 includes the error correction decoding unit 42, the communication disconnection detection unit 51, and the frame recognition unit 73. Note that the four optical signals from each of the transmission units 10 are received by four of the reception units 36. A received optical signal is processed differently depending on the states of other applicable ones of the reception units 36 that respectively receive multiple optical signals obtained by branching from a common optical signal. In addition, three of the four optical signals are the second optical signals directed to the standby system, and these three second optical signals can be prioritized in advance. For example, the optical signal transmitted by the transmission unit 10-1 is processed such that the first optical signal received by the reception unit 36-1 via the first signal path 60-1 is processed as the optical signal of the active system, and that the three second optical signals are prioritized sequentially in an order of the second optical signal received by the reception unit 36-2 via the second signal path 61-1, the second optical signal received by the reception unit 36-6 via the second signal path 62-1, and the second optical signal received by the reception unit 36-7 via the second signal path 63-1. In this case, the reception units 36 operate as illustrated in FIG. 14.

FIG. 14 is a diagram illustrating operations of part of the optical communication system 3-1 illustrated in FIG. 13. When the communication disconnection detection unit 51-1 has determined that the state of the signal from the transmission unit 10-1 is "reception successful", the error correction decoding unit 42-1 performs decoding on the first optical signal regardless of the states indicated in the determination results from the communication disconnection detection units 51-2, 51-6, and 51-7, and the error correction decoding units 42-2, 42-6, and 42-7 each discard the optical signal from the transmission unit 10-1 on a per frame basis.

Then, when a disconnection of communication has occurred in the reception unit 36-1, causing the communication disconnection detection unit 51-1 to determine that the state of the signal from the transmission unit 10-1 is "disconnection of communication", the error correction decoding unit 42-1 discards the optical signal from the transmission unit 10-1. In this case, the reception units 36 of the standby system will function as the active system sequentially in order of priority. The error correction decoding unit 42-2 will therefore perform decoding on the second optical signal transmitted from the transmission unit 10-1 regardless of the states indicated in the results of determination of the signals from the transmission unit 10-1 made by the communication disconnection detection units 51-6 and 51-7 when the communication disconnection detection unit 51-2 of the highest priority reception unit 36-2 of the standby system has determined that the state of the signal from the transmission unit 10-1 is "reception successful". The error correction decoding units 42-6 and 42-7 will each discard the signal from the transmission unit 10-1.

A case will further be considered in which the communication disconnection detection unit 51-1 has determined that the state of the signal from the transmission unit 10-1 is "disconnection of communication", and the communication disconnection detection unit 51-2 has also determined that the state of the signal from the transmission unit 10-1 is "disconnection of communication". When the communication disconnection detection unit 51-6 of the reception unit 36-6, given the second highest priority next to the reception unit 36-2, has determined that the state of the signal from the transmission unit 10-1 is "reception successful", the error correction decoding unit 42-6 will perform decoding on the second optical signal transmitted from the transmission unit 10-1 regardless of the state indicated in the result of determination of the signal from the transmission unit 10-1 made by the communication disconnection detection unit 51-7. The error correction decoding units 42-1, 42-2, and 42-7 will each discard the signal from the transmission unit 10-1.

A case will still further be considered in which the communication disconnection detection unit 51-1 has determined that the state of the signal from the transmission unit 10-1 is "disconnection of communication", and the communication disconnection detection units 51-2 and 51-6 have also each determined that the state of the signal from the transmission unit 10-1 is "disconnection of communication". In this case, the error correction decoding unit 42-7 will perform decoding on the signal from the transmission unit 10-1 regardless of the state indicated in the result of determination of the signal from the transmission unit 10-1 made by the communication disconnection detection unit 51-7 of the reception unit 36-7. The error correction decoding units 42-1, 42-2, and 42-6 will each discard the signal from the transmission unit 10-1.

Although FIG. 13 omits the corresponding part for simplicity, when detecting a disconnection of communication of a corresponding one of the reception units 36, each of the communication disconnection detection units 51-1 to 51-10 notifies, of the disconnection of communication, the applicable ones of the error correction decoding units 42 that are to process the other optical signals branched from the optical signal common to the optical signal received by the corresponding one of the reception units 36. In this operation, the communication disconnection detection unit 51 notifies, of the disconnection of communication, the error correction decoding unit or units 42 of the reception unit or units 36 given lower priority than the corresponding one of the reception units 36, among the error correction decoding units 42 that are to process the other optical signals branched from the optical signal common to the optical signal received by the corresponding one of the reception units 36. For example, an example will be described in which the four optical signals obtained by branching, by the optical coupler 20-1, from the optical signal output by the transmission unit 10-1 of FIG. 13 are respectively received by the reception units 36-1, 36-2, 36-6, and 36-7. The communication disconnection detection unit 51-1 notifies the error correction decoding units 42-2, 42-6, and 42-7 of the disconnection of communication. The communication disconnection detection unit 51-2 notifies the error correction decoding units 42-6 and 42-7 of the disconnection of communication. The communication disconnection detection unit 51-6 notifies the error correction decoding unit 42-7 of the disconnection of communication. Note that the description has been provided only for the redundant portion relating to the optical signal output by the transmission unit 10-1, of the redundant configuration of the optical communication system 3-1, but a similar description also applies to the transmission units 10-2 to 10-5.

Note that when only a single standby system is added, the functionality to receive the signals from the transmission units 10-1 and 10-2 is shared by the optical coupler 80-7 and by the reception unit 36-7, and the functionality to receive the signals from the transmission units 10-3 and 10-4 is shared by the optical coupler 80-9 and by the reception unit 36-9. This enables the optical couplers 80-6 and 80-8 and the reception units 36-6 and 36-8 to be omitted to thus reduce power consumption, and enables the system to be simply and easily expanded to include two additional standby systems.

The functionality of each of the optical communication systems 1, 1-1 to 1-4, 2, 2-1, 2-2, 2-3, 3, and 3-1 is implemented in a processing circuitry. These processing circuitries may each be implemented in a dedicated hardware element or may each be a control circuit using a central processing unit (CPU).

Figure 15:
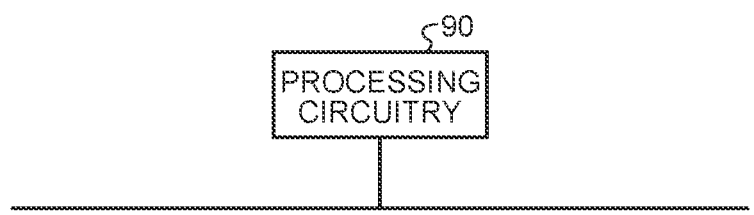
FIG. 15 is a diagram illustrating a dedicated hardware element for implementing the functionality of each of the optical communication systems according to the first through third embodiments.

When the foregoing processing circuitries are each implemented in a dedicated hardware element, these are each implemented in a processing circuitry 90 illustrated in FIG. 15. FIG. 15 is a diagram illustrating a dedicated hardware element for implementing the functionality of each of the optical communication systems 1, 1-1 to 1-4, 2, 2-1, 2-2, 2-3, 3, and 3-1 according to the first through third embodiments. The processing circuitry 90 is a single circuit, a set of multiple circuits, a programmed processor, a parallel programmed processor, an application specific integrated circuit (ASIC), a field programmable gate array (FPGA), or a combination thereof.

Figure 16:
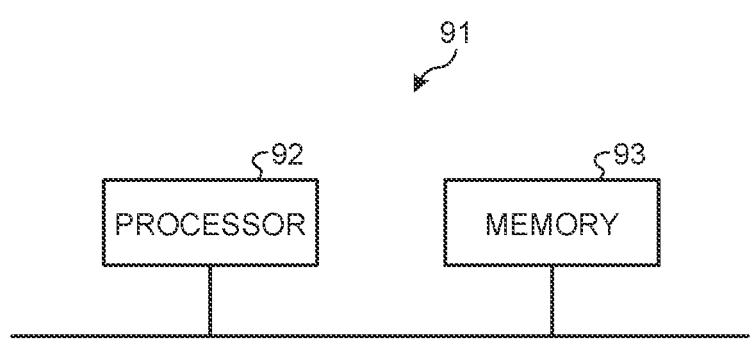
FIG. 16 is a diagram illustrating a configuration of a control circuit for implementing the functionality of each of the optical communication systems according to the first through third embodiments.

When the foregoing processing circuitries are each implemented in a control circuit using a CPU, this control circuit is, for example, a control circuit 91 having a configuration illustrated in FIG. 16. FIG. 16 is a diagram illustrating a configuration of the control circuit 91 for implementing the functionality of each of the optical communication systems 1, 1-1 to 1-4, 2, 2-1, 2-2, 2-3, 3, and 3-1 according to the first through third embodiments. As illustrated in FIG. 16, the control circuit 91 includes a processor 92 and a memory 93. The processor 92 is a CPU, which is also known as a computing unit, a microprocessor, a microcomputer, a digital signal processor (DSP), and the like. The memory 93 is, for example, a non-volatile or volatile semiconductor memory such as a random access memory (RAM), a read-only memory (ROM), a flash memory, an erasable programmable ROM (EPROM), or an electrically erasable programmable ROM (EEPROM) (registered trademark); a magnetic disk, a flexible disk, an optical disk, a compact disc, a MiniDisc, a digital versatile disk (DVD), or the like.

When the foregoing processing circuitries are each implemented in the control circuit 91, the functionality is implemented in such a manner that the processor 92 reads and executes a program corresponding to the processing of each component, stored in the memory 93. The memory 93 is also used as a temporary memory for processing performed by the processor 92. The program may be provided as stored in a storage medium, or via a communication channel.

Individual processing circuits may be used for the respective functional blocks described in the foregoing embodiments, or functionalities of multiple functional blocks may be provided by a single processing circuit. Alternatively, functionality described correspondingly to a single functional block may be provided by a set of multiple processing circuits.

The configurations described in the foregoing embodiments are merely examples. These configurations may be combined with a known other technology, and configurations of different embodiments may be combined together. Moreover, part of such configurations may be omitted and/or modified without departing from the spirit thereof.

For example, the first through third embodiments have been described in which the error correction decoding units 40 and 42 and the communication disconnection detection units 50 and 51 function as part of the reception units 30 to 35. However, the functionalities of the error correction decoding units 40 and 42 and of the communication disconnection detection units 50 and 51 may be implemented in a different processing circuit from the processing circuit of the reception units 30 to 35. This also applies to the other functional blocks.

In addition, the second embodiment has been described in the context of the reception units 35, which each receive signals from multiple transmission units 10. However, the optical communication systems 2-1 and 2-2 including such reception units 35 may each include the signal intensity measurement unit 70 and the control unit 71 such as those illustrated in FIG. 2, the iteration trial unit 72 such as one illustrated in FIG. 3, the frame recognition unit 73 such as one illustrated in FIG. 4, or the amplification unit 74 such as one illustrated in FIG. 5. Moreover, the third embodiment has been described in the context of the reception units 36, which each include the frame recognition unit 73. However, such optical communication systems 3 and 3-1 may each include, in place of the frame recognition unit 73, the signal intensity measurement unit 70 and the control unit 71 such as those illustrated in FIG. 2, the iteration trial unit 72 such as one illustrated in FIG. 3, or the amplification unit 74 such as one illustrated in FIG. 5. Note that when the reception unit 34 including the amplification unit 74 receives a signal generated by time-multiplexing of signals from multiple one of the transmission units 10, the amplification unit 74 may obtain a gain value on a per received frame basis, and determine the number of iterations on a per received frame basis.

Note that the foregoing optical communication systems 1, 1-1 to 1-4, 2, 2-1, 2-2, 2-3, 3, and 3-1 are particularly suitable for situations in which high reliability, low power consumption, and high shock resistance are required, such as, for example, a situation present in an optical communication system installed in an artificial satellite.

An optical communication system according to the present disclosure provides an advantage in capability of reducing power consumption while reducing the error rate.

What is claimed is:

1. An optical communication system comprising:
a plurality of transmitters each to perform error correction encoding on information to be transmitted, and to output a result of the error correction encoding in a form of an optical signal, the error correction encoding enabling correction performance to be provided that is dependent on a number of iterations of decoding;
a plurality of first optical couplers provided correspondingly to the plurality of respective transmitters, each to branch, at an asymmetric branching ratio, the optical signal output by a corresponding one of the transmitters, and to output a first optical signal corresponding to a highest branching ratio and a second optical signal corresponding to a non-highest branching ratio;
a plurality of receivers each to receive at least one optical signal of the first optical signal or the second optical signal;
a plurality of second optical couplers provided correspondingly to the plurality of respective receivers, each to couple together a plurality of ones of the optical signals output by corresponding respective ones of the plurality of first optical couplers, and to input a resulting optical signal into a corresponding one of the receivers;
an error correction decoding circuitry provided correspondingly to each of the plurality of receivers to perform error correction decoding on the at least one optical signal received by a corresponding one of the receivers as many times as a number of iterations that has been set; and
a communication disconnection detection circuitry to, upon detection of a disconnection of communication of the first optical signal, notify, of the disconnection of communication, the error correction decoding circuitry that is to process the second optical signal branched from an optical signal common to the first optical signal, wherein
a plurality of optical signals obtained by branching from a common optical signal are received by different ones of the receivers,
the error correction decoding circuitry that is to process the second optical signal does not perform error correction decoding on the second optical signal during normal operation in which no notification has been received of the disconnection of communication, but performs error correction decoding on the second optical signal when a notification of the disconnection of communication has been received, and
the error correction decoding circuitry that processes the first optical signal performs the error correction decoding with a smaller number of iterations than a number of iterations used by the error correction decoding circuitry that processes the second optical signal.

2. The optical communication system according to claim 1, comprising at least one of:
a first system comprising two of the transmitters, two of first optical couplers corresponding to the respective two of the transmitters, the plurality of second optical couplers that each couple together optical signals output by the respective two of the first optical couplers, and the plurality of receivers that receive respective optical signals respectively output by the plurality of second optical couplers; or
a second system comprising three of the transmitters, three of the first optical couplers corresponding to the respective three of the transmitters, two of the second optical couplers, and two of the receivers corresponding to the respective two of the second optical couplers, wherein each of the two of the second optical couplers couples together three optical signals output by the respective three of the first optical couplers.

3. The optical communication system according to claim 2, comprising:
when a number of the transmitters is an even number, as many the first systems as a quotient obtained by dividing, by 2, the number of the transmitters, and
when the number of the transmitters is an odd number, one of the second systems and as many the first systems as a quotient obtained by dividing, by 2, a difference obtained by subtracting 3 from the number of the transmitters.

4. The optical communication system according to claim 2, comprising:
when a number of the transmitters is a multiple of 3, as many the second systems as a quotient obtained by dividing, by 3, the number of the transmitters,
when the number of the transmitters is a sum of 1 and a multiple of 3, two of the first systems and as many the second systems as a quotient obtained by dividing, by 3, a difference obtained by subtracting 4 from the number of the transmitters, and
when the number of the transmitters is a sum of 2 and a multiple of 3, one of the first systems and as many the second systems as a quotient obtained by dividing, by 3, a difference obtained by subtracting 2 from the number of the transmitters.

5. The optical communication system according to claim 1, comprising:
two of the second optical couplers and two of the receivers, wherein
one of the two of the second optical couplers couples together as many the first optical signals as a number of the first optical couplers, the first optical signals having been output by the plurality of respective first optical couplers, and inputs a resulting optical signal into a corresponding one of the receivers, and
another one of the two of the second optical couplers couples together as many the second optical signals as the number of the first optical couplers, the second optical signals having been output by the plurality of respective first optical couplers, and inputs a resulting optical signal into a corresponding one of the receivers.

6. The optical communication system according to claim 1, wherein
the optical communication system comprises as many the receivers as an integer multiple of a number of the transmitters,
the first optical couplers and the second optical couplers form a ring topology,
each of the second optical couplers couples together the first optical signal output by one of two of the first optical couplers connected to that second optical coupler, and the second optical signal output by another one of the two of the first optical couplers connected to that second optical coupler, and
each of the plurality of transmitters outputs the optical signal to avoid overlapping of time periods of inputting the first optical signal and the second optical signal that are to be input to a same one of the second optical couplers, to that second optical coupler.

* * * * *